United States Patent
Cheung et al.

(10) Patent No.: US 7,436,056 B2
(45) Date of Patent: Oct. 14, 2008

(54) ELECTRONIC COMPONENT PACKAGE

(75) Inventors: Tszshing Cheung, Kawasaki (JP);
Tadashi Ikeuchi, Kawasaki (JP);
Takatoshi Yagisawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 149 days.

(21) Appl. No.: 11/456,870

(22) Filed: Jul. 12, 2006

(65) Prior Publication Data
US 2007/0241447 A1 Oct. 18, 2007

(30) Foreign Application Priority Data
Apr. 17, 2006 (JP) ............................ 2006-113454

(51) Int. Cl.
*H01L 23/04* (2006.01)
*H01L 23/12* (2006.01)

(52) U.S. Cl. ................ 257/698; 257/704; 257/710; 257/E23.067; 257/E23.18; 257/E23.19; 257/E23.189; 257/E23.193; 257/E23.128; 257/E21.5; 257/E21.501

(58) Field of Classification Search ............. 257/698, 257/704, E23.067, E23.189, E23.193, 710, 257/E21.5, E21.501, E23.128, E23.18, E23.19
See application file for complete search history.

(56) References Cited

U.S. PATENT DOCUMENTS

| 4,739,448 A | * | 4/1988 | Rowe et al. ................ 361/719 |
| 5,168,344 A | | 12/1992 | Ehlert et al. |
| 6,410,847 B1 | * | 6/2002 | Allen et al. ................ 174/390 |
| 2006/0103004 A1 | * | 5/2006 | Sakai et al. ................ 257/700 |

* cited by examiner

*Primary Examiner*—Long K Tran
(74) *Attorney, Agent, or Firm*—Staas & Halsey LLP

(57) ABSTRACT

An electronic component package includes a dielectric substrate having a first surface where an electronic component is sealed. A first signal line connecting to the electronic component and a first ground conductor are formed on the first surface of the dielectric substrate. A second signal line connected to an outside connection electrode and a second ground conductor are formed on a second surface of the dielectric substrate. The first ground conductor and the second ground conductor are connected by a plurality of ground conductor via-holes. A substrate-buried signal line connected to the first signal line and the second signal line is provided inside of the dielectric substrate so as to be put between the first ground conductor and the second ground conductor above and below and between the ground conductor via-holes on the right and left.

19 Claims, 27 Drawing Sheets

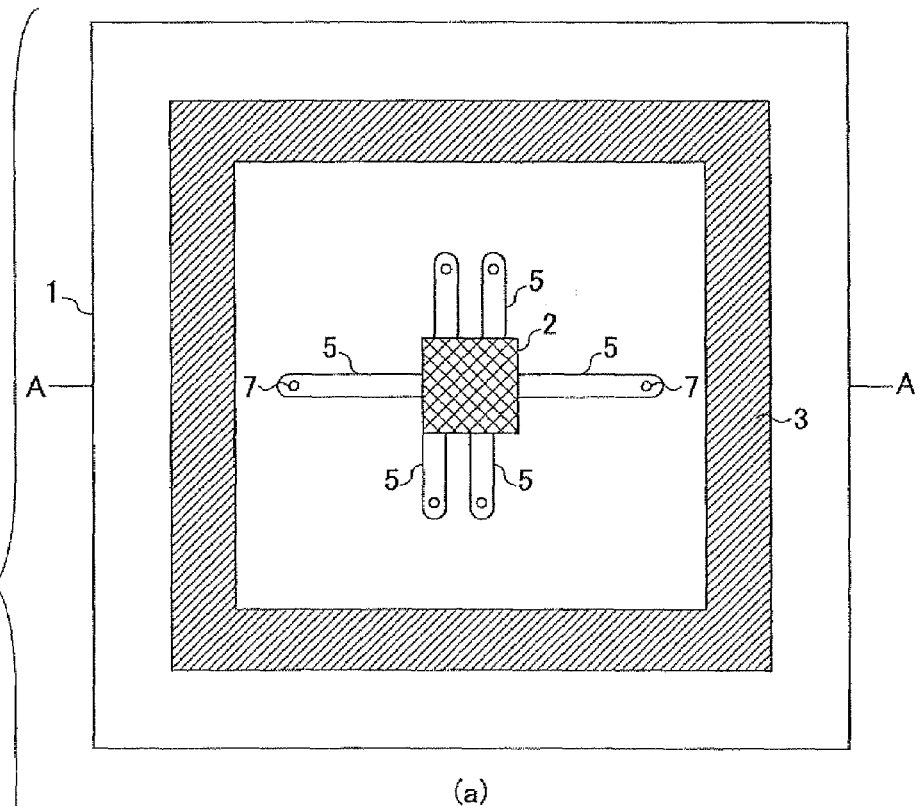
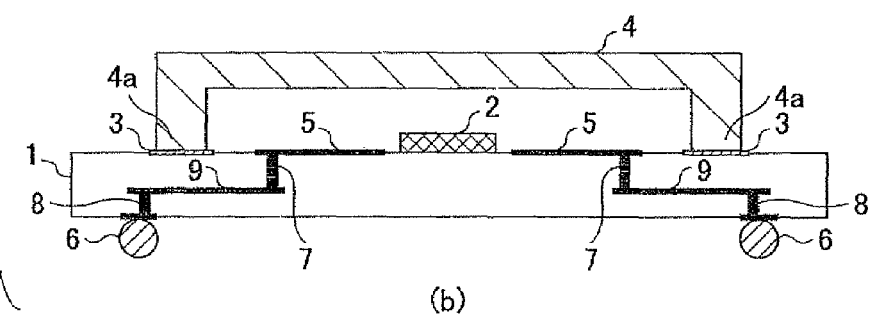
FIG.1
PRIOR ART (a)
(b)

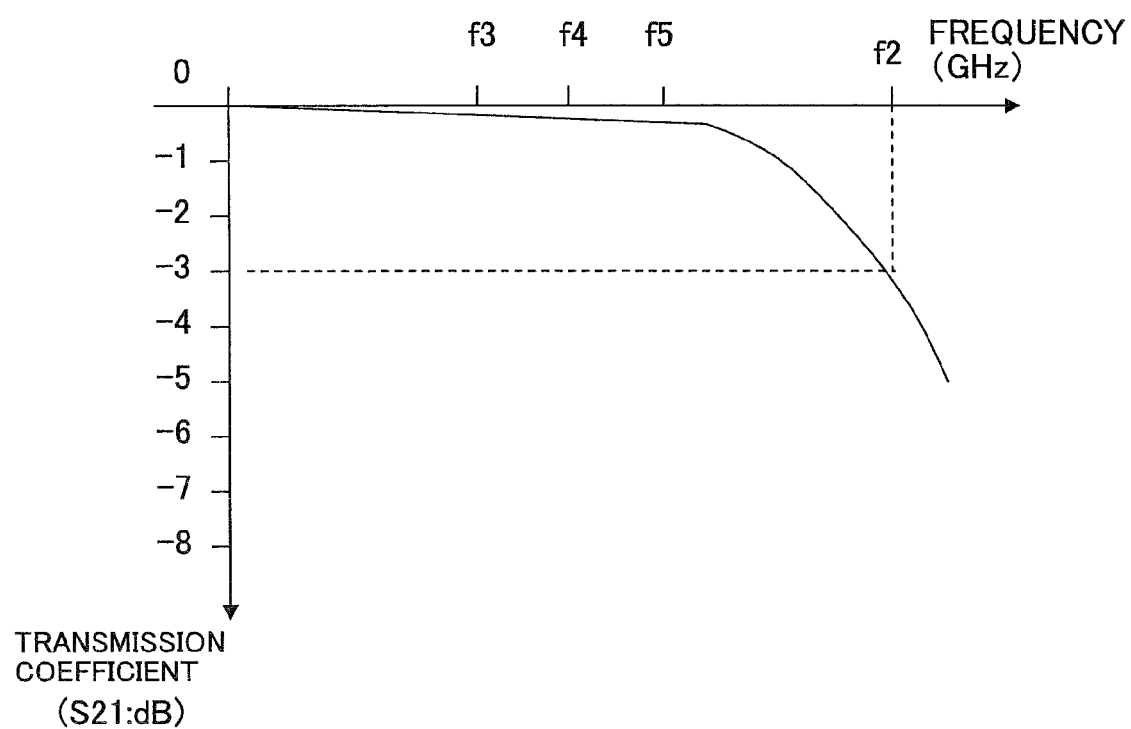

ELECTRONIC COMPONENT PACKAGE

BACKGROUND OF THE INVENTION

1. Field of the Invention

The present invention generally relates to electronic component packages, and more specifically, to a structure of a package for surface mounting an electronic component used for high speed signal transmission.

2. Description of the Related Art

Conventionally, a sealing package for surface mounting has been widely used as a high speed IC package in an optical communication system or a communication system having an electrooptical interface circuit for signal transmission whose transmission speed is approximately 40 Gbps.

In such a sealing package for surface mounting, an electronic component is sealed in a cavity formed by a dielectric substrate, a lid connected to a surface of the dielectric substrate, and others. The electric component is connected to an electrode formed on a surface of the dielectric substrate opposite to a surface where signal lines are formed.

FIG. 1 is a view showing a related art package having an electronic component. More specifically, FIG. 1-(a) is a plan view of a related art package substrate where the lid part is not provided on an upper surface. FIG. 1-(b) is a cross-sectional view taken along a line A-A of FIG. 1-(a) where the lid part is provided on the upper surface. See U.S. Pat. No. 5,168,344, for example.

Referring to FIG. 1, a large scale integrated circuit (LSI) is mounted on a substantially center part of the package substrate 1. A ground conductor 3 made of a metal is provided outside of and surrounding the LSI 2 along four sides of the upper surface of the package substrate 1 in a rectangular ring shape.

A wall part 4a of the lid part 4 made of the metal or a dielectric body is mounted on the ground conductor 3 so that a cavity is formed inside of the lid part 4. The LSI 2 is sealed in such a cavity.

Signal lines 5 connected to the LSI 2 are provided on the upper surface of the package substrate 1. Electrodes 6 are provided in the vicinities of edge parts of a lower surface of the package substrate 1. The signal lines 5 and the corresponding electrodes 6 are connected to each other via via-holes 7 and 8 and an intermediate signal line 9 provided in the package substrate 1.

Therefore, if the package substrate 1 is mounted on a printed wiring board (not shown in FIG. 1), the LSI 2 and the signal line pattern of the printed wiring board are connected via the electrodes 6.

However, in a structure shown in FIG. 1, since a high frequency characteristic is not considered, impedance mismatch is generated at the intermediate signal line 9 positioned below the ground conductor 3 provided on the upper surface of the package substrate 1. Such an impedance mismatch causes large transmission loss when the signal frequency increases so that the communication speed is decreased.

In addition, contact between the package substrate 1 and the printed wiring board (not shown in FIG. 1) where the package substrate is mounted limits the frequency characteristic so as to affect the maximum operating frequency.

More specifically, in a case where the package substrate 1 is made of a dielectric body such as ceramic in the structure shown in FIG. 1, inventors of the present invention recognize through simulation that a −3 dB cut-off frequency is less than approximately 35 GHz.

SUMMARY OF THE INVENTION

Accordingly, the present invention may provide a novel and useful electronic component package solving one or more of the problems discussed above.

Another and more specific object of the present invention may be to provide an electronic component package for surface mounting whereby small signal transmission loss and a high cut-off frequency can be realized.

The above object of the present invention is achieved by an electronic component package, including: a dielectric substrate having a first surface where an electronic component is sealed; wherein a first signal line connecting to the electronic component and a first ground conductor are formed on the first surface of the dielectric substrate; a second signal line connected to an outside connection electrode and a second ground conductor are formed on a second surface of the dielectric substrate; the first ground conductor and the second ground conductor are connected by a plurality of ground conductor via-holes; and a substrate-buried signal line connected to the first signal line and the second signal line is provided inside of the dielectric substrate so as to be put between the first ground conductor and the second ground conductor above and below and between the ground conductor via-holes on the right and left.

The substrate-buried signal line may be connected to the first signal line and the second signal line by a via-hole. The electronic component may be sealed by providing a lid part on the dielectric substrate; and the first ground conductor may function as a contact between the dielectric substrate and the lid part.

A ground conductor electrode extended from the second ground conductor may be formed at both sides of the outside connection electrode connected to the second signal line. A metal plate may be provided under the second signal line. A first surface of the electronic component may be positioned substantially coplanar with the first surface of the dielectric substrate. The dielectric substrate may be a multi-layer substrate; a layer signal line may be formed on a second surface of each layer of the dielectric substrate; and the layer signal lines may be connected to each other by a via-hole so that the substrate-buried signal line is formed.

A wall part made of a dielectric material may be provided in the vicinity of an end part of the dielectric substrate. Substrate inside ground conductors may be provided at both sides of the substrate-buried signal line.

According to an embodiment of the present invention, it is possible to provide the electronic component package for surface mounting whereby small signal transmission loss and a high cut-off frequency can be realized.

Other objects, features, and advantages of the present invention will be come more apparent from the following detailed description when read in conjunction with the accompanying drawings.

BRIEF DESCRIPTION OF THE DRAWINGS

FIG. 1 is a view showing a related art package having an electronic component;

FIG. 32 is a graph showing a transmission characteristic of the package substrate having the structure shown in FIG. 31.

DETAILED DESCRIPTION OF THE PREFERRED EMBODIMENTS

A description is given below, with reference to the FIG. 2 through FIG. 32 of embodiments of the present invention.

First Embodiment of the Present Invention

Figure 2:
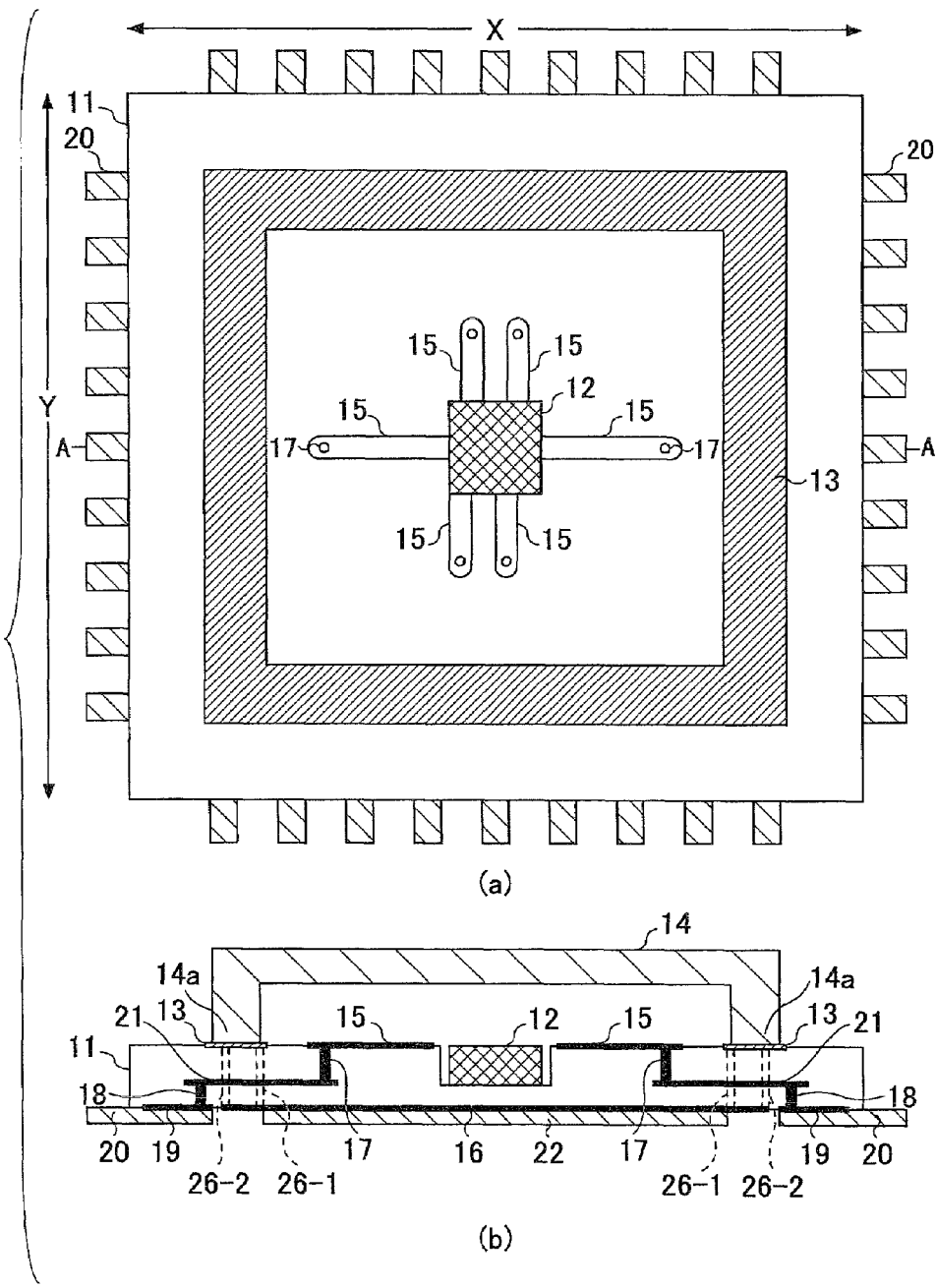
FIG. 2 is a view showing a schematic structure of a package having an electronic component of a first embodiment of the present invention.

FIG. 2 is a view showing a schematic structure of a package having an electronic component of a first embodiment of the present invention. More specifically, FIG. 2-(a) is a plan view of a package substrate where a lid part is not provided on an upper surface (first surface). FIG. 2-(b) is a cross-sectional view taken along a line A-A of FIG. 2-(a) where he lid part is provided on the upper surface.

Referring to FIG. 2, a large scale integrated circuit (LSI) 12 is mounted on a substantially center part of the package substrate 11. A ground conductor 13 made of a metal pattern is provided outside of the LSI 12 along four sides of the upper surface of the package substrate 11 in a substantially rectangular shape.

The package substrate 1 is a dielectric substrate and may be made of ceramic or the like. While the LSI 12 is illustrated in FIG. 2, the present invention is not limited to this example. An integrated circuit (IC), a passive element, an active element or combination thereof may be provided in the substantially center part of the package substrate 11. In addition, while the first ground conductor 13 is provided on the upper surface of the package substrate 11 in a substantially rectangular ring shape in plan view in the example shown in FIG. 2, the first ground conductor 13 may be provided in a circular ring shape, elliptic type ring shape or a rectangular or polygon ring shape.

A wall part 14a of the lid part 14, the lid part 14 having a cross section of a rectangular shape without one side as viewed in FIG. 2(b) (inverted "U" shape), is mounted on the first ground conductor 13 and the wall part 14a and the first ground conductor 13 are connected by soldering. As a result of this, a cavity where the LSI 12 is provided is formed inside of the lid part 14. In other words, the first ground conductor 13 functions to contact the lid part 14 so that the LSI 12 is sealed. The lid part 14 is made of for example, metal or dielectric material.

With the sealing structure of FIG. 2, it is possible to achieve a higher speed characteristic than with a package not having a sealing structure.

In addition, first signal lines 15 are provided in an inside area not overlapping the first ground conductor 13 of the upper surface of the package substrate 11. The first signal lines 15 are connected to the LSI 12 by bonding wires discussed below (not shown in FIG. 2).

A second ground conductor 16 made of a metal pattern is provided at a part corresponding to the part where the first ground conductor 13 is provided and to an inside area of the part. In addition, a second signal line 19 is provided outside of the part corresponding to the part where the first ground conductor 13 is provided. Although details are discussed below, the first ground conductor 13 is connected to the second ground conductor 16 via via-holes 26-2 and 26-2 shown by dotted lines in FIG. 2.

A metal lead 20 extending outside of the package substrate 11 is connected to the second signal line 19 as an outside connection electrode. While the metal lead is provided as the outside connection electrode in this example, the package substrate 11 may be a BGA (ball grid array) substrate where a solder ball is used as the outside connection electrode.

A third signal line 21 as a substrate-buried signal line is provided inside of the package substrate 11. The third signal line 21 is connected to the first signal line 15 via a first via-hole 17 formed in the package substrate 11 in a vertical direction and connected to the second signal line 19 via a second via-hole 18 formed in the package substrate 11 in a vertical direction, so that a signal is transmitted. The first via-hole 17 and the second via-hole 18 are provided so as not to overlap the first ground conductor 13 provided on the upper surface of the package substrate 11.

Thus, the first ground conductor 13 is provided on the upper surface of the package substrate 11 and the second ground conductor 16 is provided on a lower surface (second surface) of the package substrate 11. The first ground conductor 13 and the second ground conductor 16 are connected to each other via the via-holes 26-1 and 26-2. In addition, the third signal line 21 is provided so as to be put between the first ground conductor 13 (above) and the second ground conductor 13 (below) and between the via-holes 26-1 (on the right) and 26-2 (on the left).

In other words, the third signal line 21 connecting the first signal line 15 and the second signal line 19 is surrounded by the ground conductors on all sides and provided inside of the package substrate 11.

A metal plate 22 is provided under the second ground conductor 16 so as to be separated from the end part of the metal lead 20. In a case where the metal plate 22 is not provided, even if the signal lines 15, 19 and 21 are provided on and in the package substrate 11 by performing impedance matching so that input impedance and output impedance are, for example, approximately 50 Ω each, the impedance may be mismatched if the package substrate 11 is mounted on the printed wiring board (not shown in FIG. 2). However, it is possible to avoid such a situation by providing the metal plate 22. In addition, it is possible to secure a good solder connection at the time when the package substrate 11 is provided on the printed wiring board (not shown in FIG. 2), by the metal plate 22. Here, the metal plate 22 is made of a metal such as gold (Au) or copper (Cu).

Figure 3:
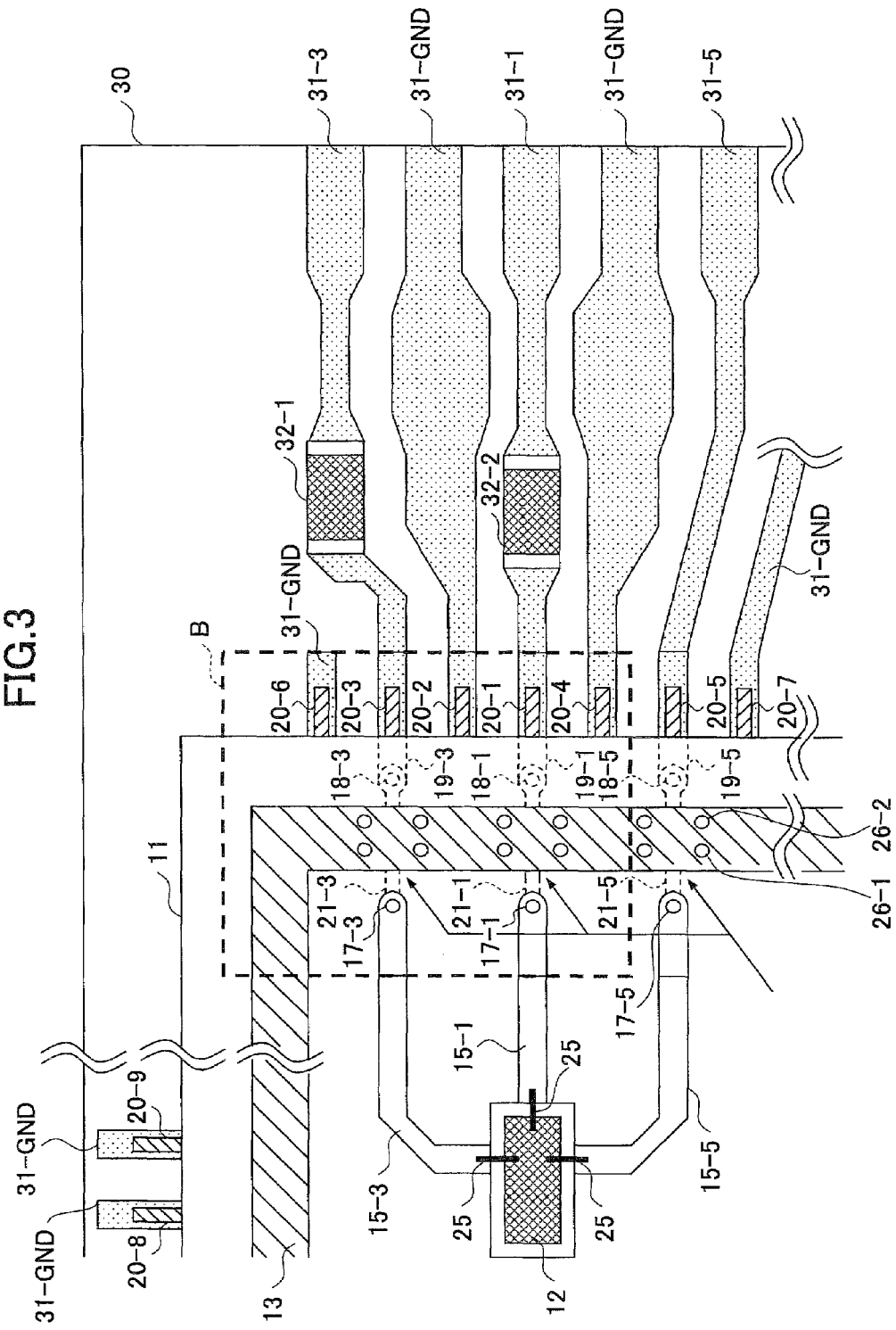
FIG. 3 is a plan view showing parts of a printed wiring board and a package substrate shown in FIG. 1 mounted on the printed wiring board.

FIG. 3 is a plan view showing parts of a printed wiring board and the package substrate 11 shown in FIG. 1 mounted on the printed wiring board. In FIG. 3, illustration of the lid part 14 shown in FIG. 2 is omitted.

Referring to FIG. 3, the package substrate 11 is mounted on the printed wiring board 30. Plural metal patterns 31 are provided on the upper surface of the printed wiring board 30.

A signal line 31-1 connected to the first signal line 15-1 of the package substrate 11, a signal line 31-3 connected to the first signal line 15-3 of the package substrate 11, a signal line 31-5 connected to the first signal line 15-5 of the package substrate 11, and ground conductors provided between the signal lines 31-1 and 31-3 and between the signal lines 31-3 and 31-5, are shown in FIG. 3.

Thus, in this embodiment, the printed wiring board 30 has a CPW (Coplanar Waveguide) type transmission line structure where a signal line (the signal line 31-1, for example) being a high frequency signal wiring conductor is put between the ground conductors 31-GND with designated gaps. However, the present invention is not limited to this. The printed wiring board 330 may have a GCPW (Grounded Coplanar Waveguide) type transmission line structure where a high frequency signal line (the signal line 31-1, for example) is provided on a surface so as to be put between the ground conductors 31-GND with designated gaps and the ground conductor 31-GND is connected to the ground conductor provided on the rear surface via the via-hole. It is possible to perform high speed signal transmission in either case.

Furthermore, in the package substrate 11, the first signal line 15-1 (15-3, 15-5) is connected to the LSI 12 provided in the substantially center part of the upper surface of the package substrate 11 by bonding wires 25.

The first signal line 15-1 (15-3, 15-5) is connected to the metal lead 20-1 (20-3, 20-5) extending outside the package substrate 11, via the first via-hole 17-1 (17-3, 17-5), the third signal line 21-1 (21-3, 21-5) shown by a dotted line in FIG. 3, the second via-hole 18-1 (18-3, 18-5), and the second signal line 19-1 (19-3, 19-5).

The metal lead 20-1 (20-3, 20-5) is connected to a signal line 31-1 (31-3, 31-5) of the printed wiring board 30. Another metal lead 20-2 (20-4, 20-6, 20-7, 20-8, and 20-9) is connected to the ground conductor 31-GND of the printed wiring board 30. In the example shown in FIG. 3, the signal lines 31-1 and 31-3 of the printed wiring board 30 are connected to the electronic components 32-1 and 32-2 provided on the upper surface of the printed wiring board 30 such as a passive element, a active element, an LSI, an IC, or combination thereof.

Although details are discussed below, plural first ground conductor connection via-holes 26-1 and second ground conductor connection via-holes 26-2 are formed in the first ground conductor 13 provided along the four sides of the upper surface of the package substrate 11 in the ring shape so as to be arranged in directions substantially perpendicular to arrangement directions of the first signal line 15, the second signal line 19, and the third signal line 19.

Figure 4:
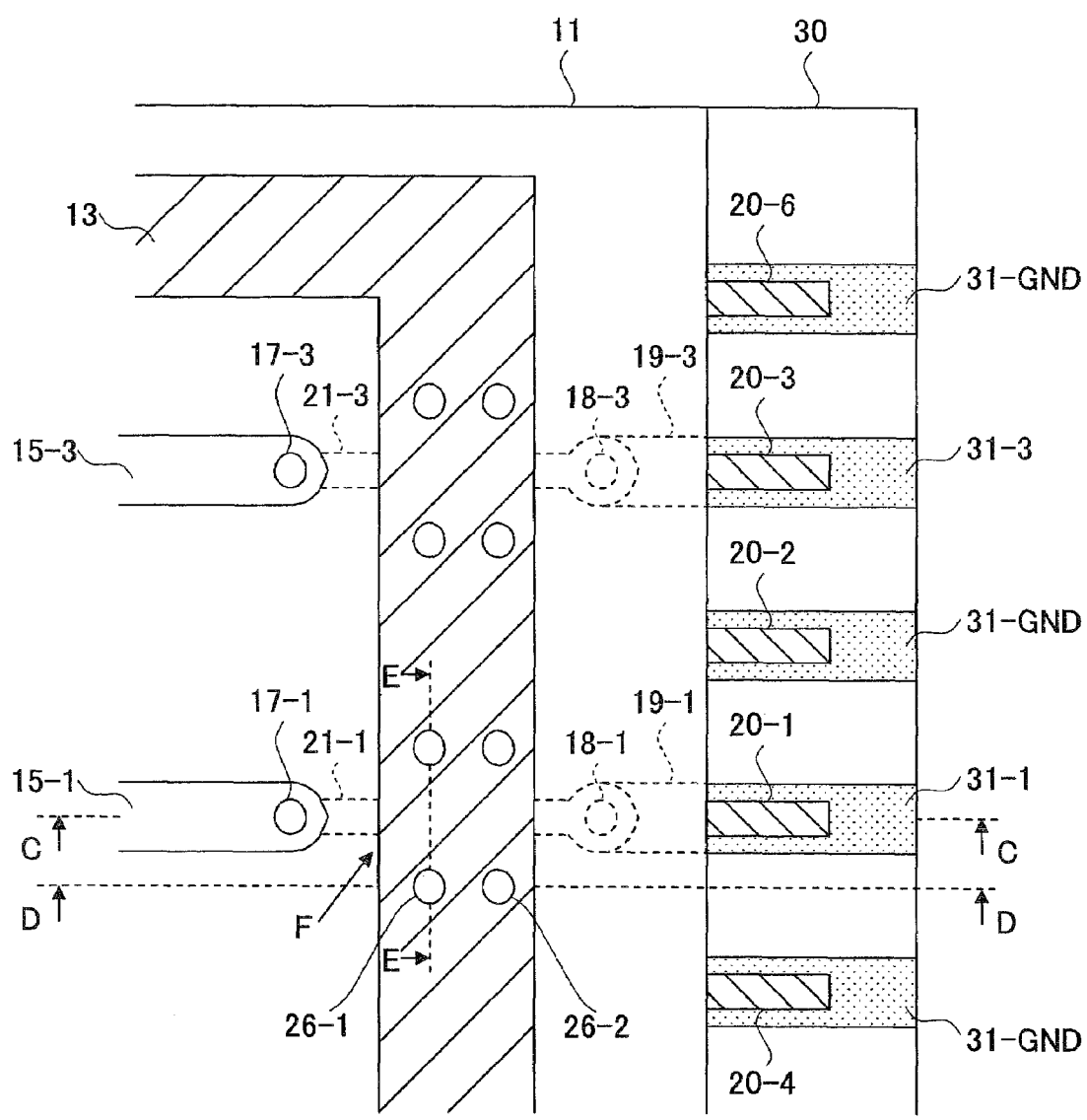
FIG. 4 is a detail view of a part surrounded by a dotted line B in FIG. 3.
Figure 5:
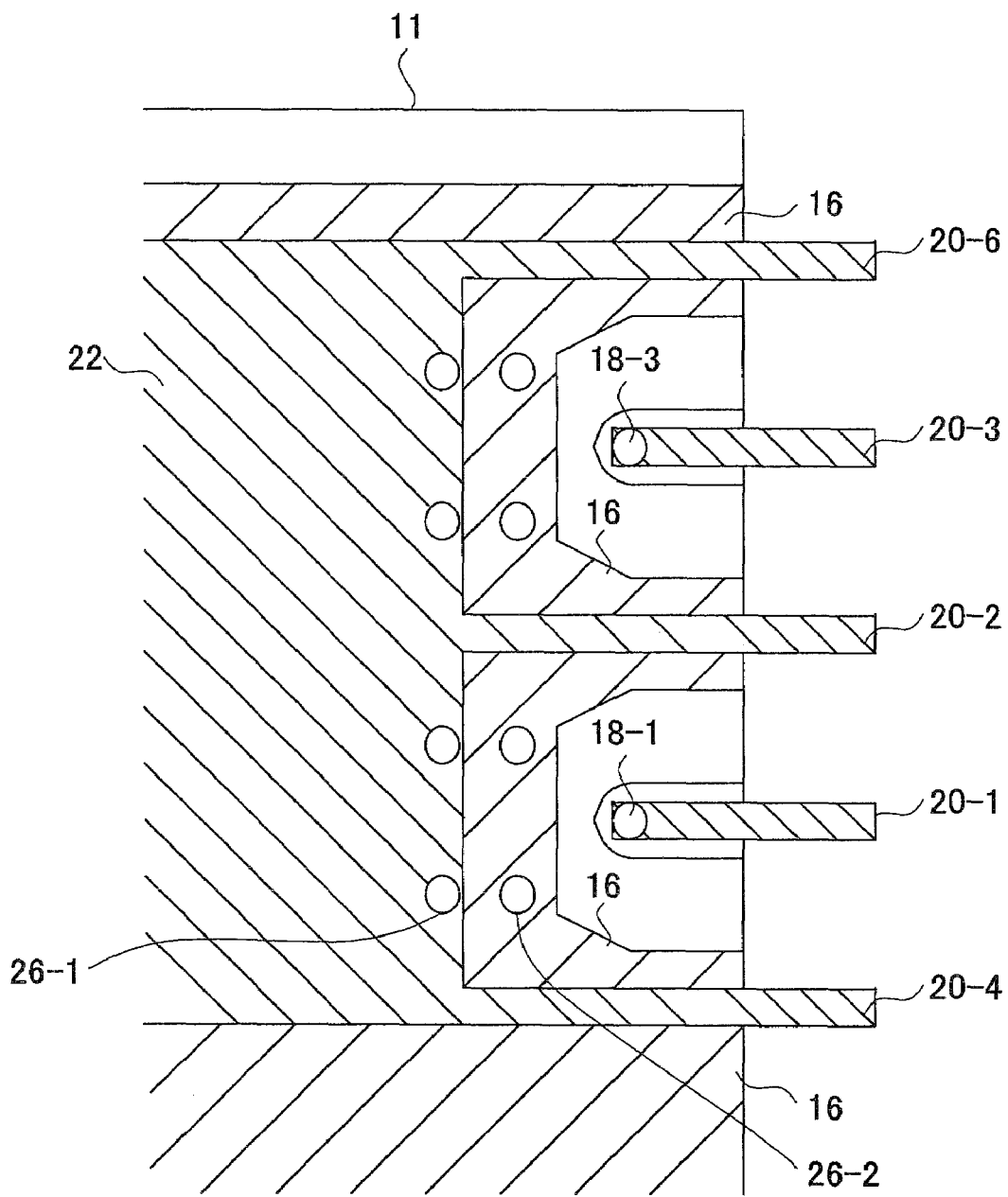
FIG. 5 is a bottom view of the package substrate shown in FIG. 4.

FIG. 4 is a detail view of a part surrounded by a dotted line B in FIG. 3. FIG. 5 is a bottom view of the package substrate shown 11 in FIG. 4.

Referring to FIG. 4 and FIG. 5, metal leads 20-1 and 20-3 connected to signal lines 31-1 and 31-3 of the printed wiring board 30 and other metal leads 20-2, 20-4 and 20-6 connected to the ground conductor 31-GND of the printed wiring board 30 extend outside of the package substrate 11.

The metal leads 20-2, 20-4 and 20-6 connected to the ground conductor 31-GND of the printed wiring board 30 and functioning as ground conductor electrodes extend from the metal plate 22 being the ground conductor.

In the example shown in FIG. 4, only a single metal lead 20-2 as a ground conductor is provided between the metal lead 20-1 connected to the signal line 31-1 of the printed wiring board 30 and the metal lead 20-3 connected to the signal line 31-3 of the printed wiring board 30. However, the present invention is not limited to this example. The present invention may be applied to the structure shown in FIG. 6.

Figure 6:
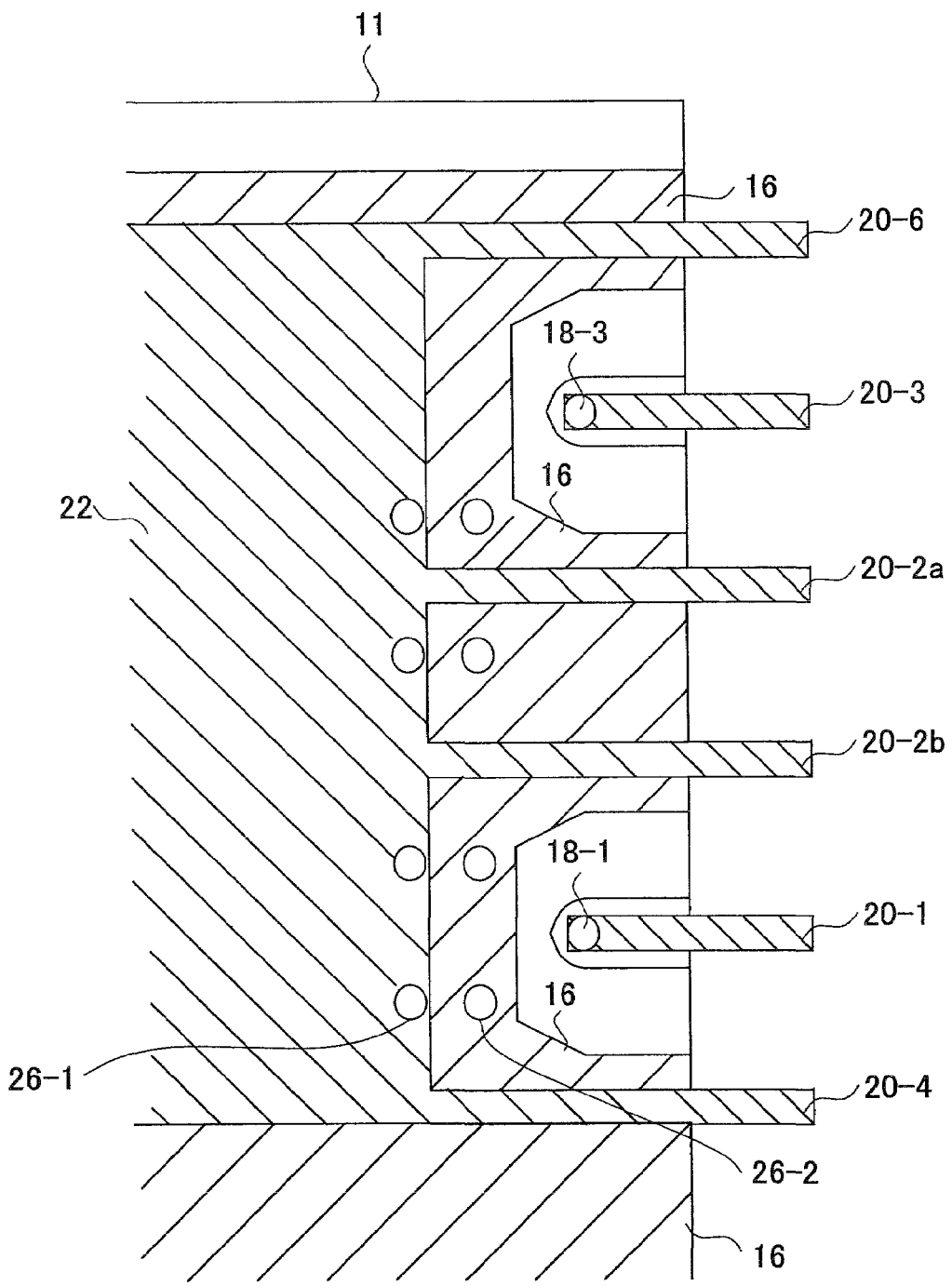
FIG. 6 is a bottom view of a modified example of the package substrate shown in FIG. 5.

Here, FIG. 6 is a bottom view of a modified example of the package substrate 11 shown in FIG. 5. In FIG. 6, parts that are the same as the parts shown in FIG. 6 are given the same reference numerals, and explanation thereof is omitted.

Referring to FIG. 6, in this modified example, two metal leads 20-2a and 20-2b extending from the metal plate 22 as ground conductors are provided between the metal lead 20-1 connected to the signal line 31-1 of the printed wiring board 30 and the metal lead 20-3 connected to the signal line 31-3 of the printed wiring board 30. Such a structure is effective in a case of the package where the high frequency signal lines are provided in close formation with short pitches. By this structure, it is possible to obtain a good high frequency characteristic under high ground stability.

Figure 7:
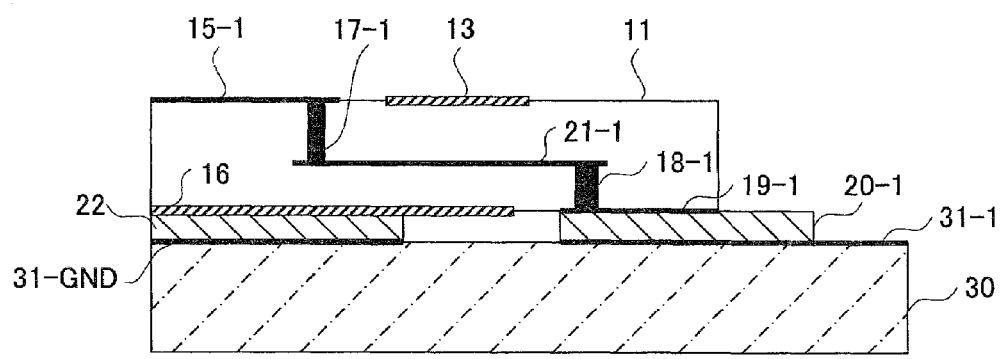
FIG. 7 is a cross-sectional view taken along line C-C of FIG. 4.
Figure 8:
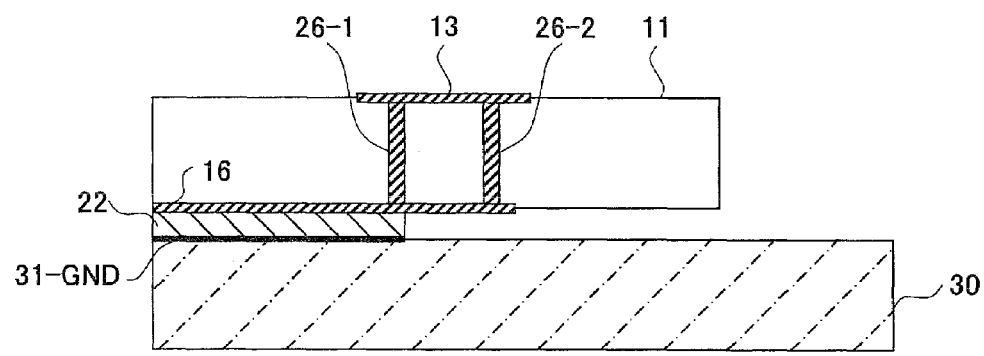
FIG. 8 is a cross-sectional view taken along line D-D of FIG. 4.

Next, internal structures of the package substrate 11 and the printed wiring board 30 are discussed with reference to FIG. 7 and FIG. 8. Here, FIG. 7 is a cross-sectional view taken along line C-C of FIG. 4. FIG. 8 is a cross-sectional view taken along line D-D of FIG. 4.

Referring to FIG. 7 and FIG. 8, the first signal line 15-1 provided on the upper surface of the package substrate 11 is connected to the third signal line 21-1 provided inside of the package substrate 11 via the first via-hole 17-1 formed in the package substrate 11 in a vertical direction. The third signal line 21-1 is connected to the second signal line 19-1 provided on the lower surface of the package substrate 11 via the second via-hole 18-1 formed in the package substrate 11 in a vertical direction. See FIG. 7.

In addition, the third signal line 21-1 is provided inside of the package substrate 11 in a state where the third signal line 21-1 is put between the first ground conductor 13 provided on the upper surface of the package substrate 11 and the second ground conductor 16 provided on the lower surface of the package substrate 11 upper and lower. See FIG. 7.

In addition, the first ground conductor 13 and the second ground conductor 16 are connected to each other by the ground conductor connection via-holes 26-1 and 26-2. See FIG. 8.

In other words, the third signal line 21-1 is provided under a tunnel structure so as to be surrounded on all side inside of the package substrate 11.

Figure 9:
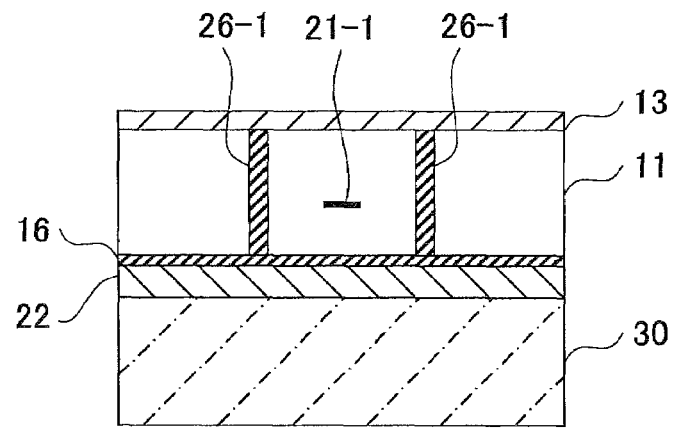
FIG. 9 is a cross-sectional view taken along line E-E of FIG. 4.
Figure 10:
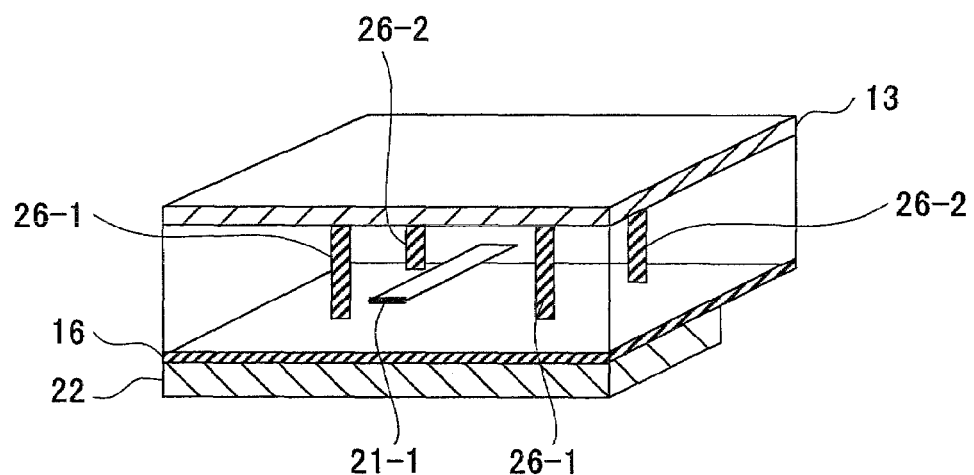
FIG. 10 is a perspective view seen from a direction shown by an arrow F in FIG. 4.

Such a tunnel structure is further discussed with reference to FIG. 9 and FIG. 10. Here, FIG. 9 is a cross-sectional view taken along line E-E of FIG. 4. FIG. 10 is a perspective view seen from a direction shown by an arrow F in FIG. 4.

Referring to FIG. 9 and FIG. 10, the third signal line 21-1 is surrounded from all quarters by the first ground conductor 13 provided on the upper surface of the package substrate 11, the second ground conductor 16 provided on the lower surface of the package substrate 11, and the ground conductor connection via-holes 26-1 and 26-2 connecting the first ground conductor 13 and the second ground conductor 16 in the vertical direction.

Thus, by providing the ground conductors on all four side of the third signal line 21-1,1 it is possible to perform impedance matching so that the input and output impedances each have a desirable value such as approximately 50 Ω.

Especially, the ground conductor connection via-holes 26-1 and 26-2 connecting the first ground conductor 13 and the second ground conductor 16 function as direct and short path of a return current of a signal. Therefore, an electric floating state of the first ground conductor 13 can be avoided and generation of resonance can be prevented. In addition, by the ground conductor connection via-holes 26-1 and 26-2, it is possible to shorten the length of current paths between the first ground conductor 13 and the second ground conductor 16.

The first via-hole 17, the second via-hole 18, and the first and second ground conductor connection via-holes 26-1 and 26-2 may be made in a well-known method. For example, a hole may be formed in the package substrate 11 mechanically or by using a laser and the entirety of the hole may be plated for conducting so that the first via-hole 17, the second via-hole 18, and the first and second ground conductor connection via-holes 26-1 and 26-2 can be made. Furthermore, layers where the holes are formed by using the laser or the like may be stacked and metal pastes may be used to fill in the holes so that the first via-hole 17, the second via-hole 18, and the first and second ground conductor connection via-holes 26-1 and 26-2 can be made.

Next, a transmission characteristic and a reflection characteristic of the package having such a structure is discussed with reference to FIG. 11. Here, FIG. 11 is a graph showing the transmission characteristic and the reflection characteristic of the package of an embodiment of the present invention.

Figure 11:
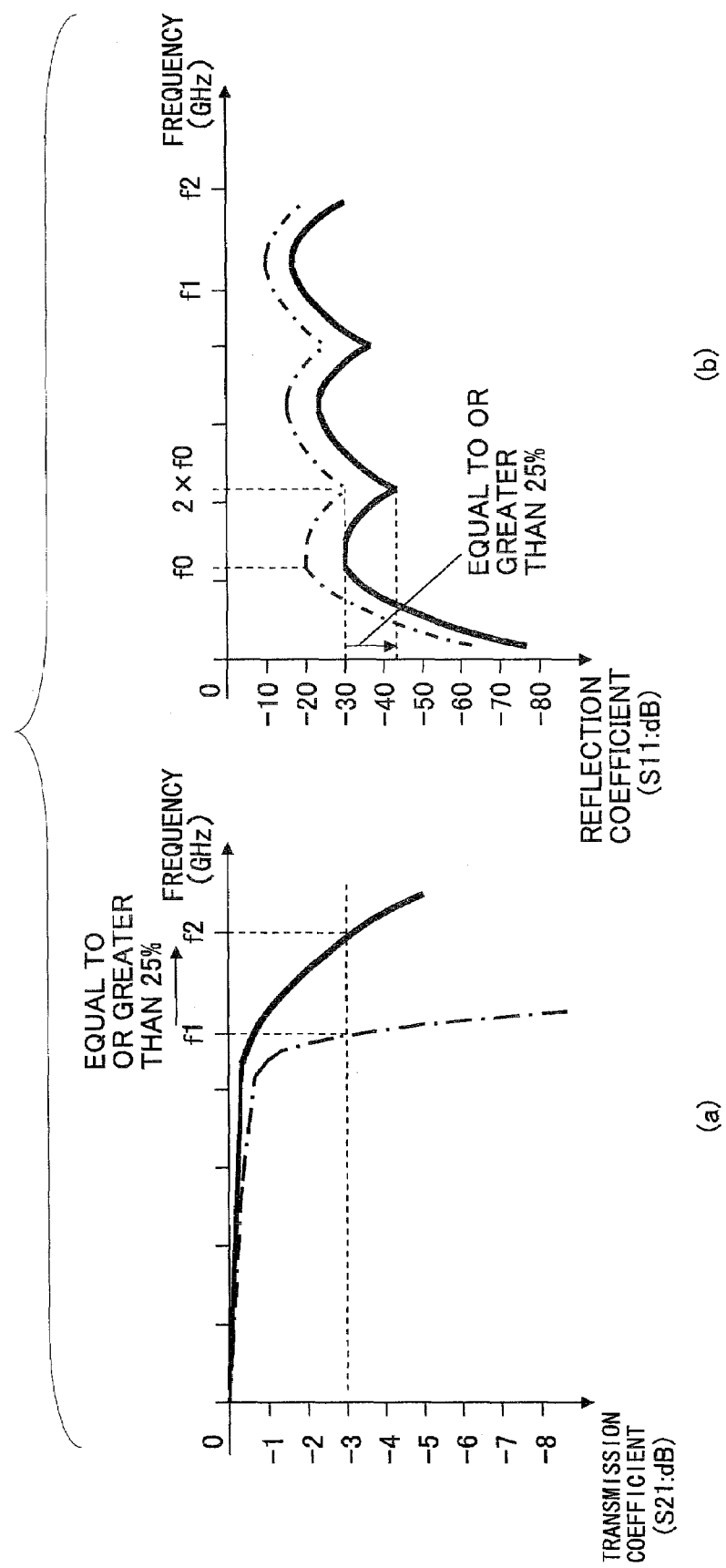
FIG. 11 is a graph showing a transmission characteristic and a reflection characteristic of a package of an embodiment of the present invention.

More specifically, FIG. 11-(a) shows the transmission characteristic in comparison with the related art structure shown in FIG. 1. FIG. 11-(b) shows the reflection characteristic in comparison with the related art structure shown in FIG. 1. In these graphs, a case of the package of the embodiment of the present invention is shown by a solid line and a case of the package of the related art shown in FIG. 1 is shown by a dotted line.

Referring to FIG. 11-(a), the horizontal axis represents frequency (GHz) and the vertical axis represents a transmission characteristic S21 (dB). A characteristic curve represents the frequency characteristic. The package of the embodiment of the present invention, as compared with the related art structure shown in FIG. 1, has small transmission loss and is suitable for high speed communication.

Especially, a 3 dB cut-off frequency (f2) where there is 3 dB attenuation of the package of embodiment of the present invention is greater than a 3 dB cut-off frequency (f1) wherein there is 3 dB attenuation of the case of the package of the related art shown in FIG. 1, by approximately 25% or more.

For example, in a case where the package substrate has length X of approximately 1 cm and width Y (See FIG. 2) of approximately 1 cm, while the 3 dB cut-off frequency (f1) of the package of the related art shown in FIG. 1 is approximately 35 GHz, the 3 dB cut-off frequency (f2) of the package of the embodiment of the present invention is approximately 45 GHz, the frequency (f2) being higher than the 3 dB cut-off frequency (f1) of the package of the related art shown in FIG. 1. Hence, it is possible to achieve a good transmission characteristic, a good high speed operations and reduced consumption of electric power.

Next, referring to FIG. 1-(b), the horizontal axis represents frequency (GHz) and the vertical axis represents a reflection characteristic S11 (dB). A characteristic curve represents the frequency characteristic.

In a case where the frequency is twice that of the reflection characteristic f0, the reflection characteristic of the package of the embodiment of the present invention, as compared with the related art structure shown in FIG. 1, is lower by approximately 25% and more, so that a low noise signal transmission at the signal line can be made.

Here, the reflection frequency f0 is expressed by the following formula when Er represents the dielectric constant of the package substrate.

$$f0 = \text{speed of light}/(2 \times \text{length of the signal line} \times Er)$$

For example, in a case where the length X (See FIG. 2) of the package substrate is approximately 1 cm, the length of the signal line is approximately 0.5 cm. If the package substrate is made of ceramic, the dielectric constant is approximately 8. Therefore, the reflection frequency f0 is calculated as approximately 7 GHz.

In the meantime, referring back to FIG. 2, in the embodiment of the present invention, the thickness ("t" in FIG. 2) of the metal lead 20 extending to the outside of the package substrate 11 may be equal to or greater than approximately 0.05 mm and equal to or smaller than 0.3 mm if the package substrate 11 is made of ceramic. This is discussed with reference to FIG. 12.

Figure 12:
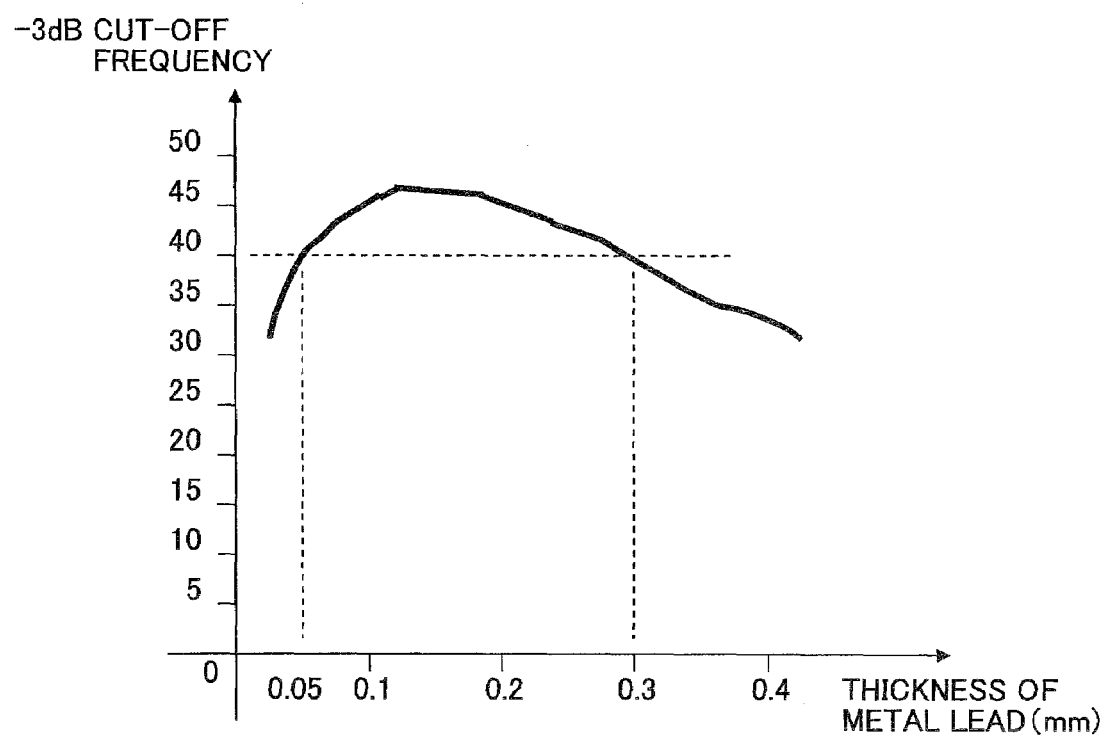
FIG. 12 is a graph showing a relationship between a frequency characteristic of a package and thickness of a metal lead of the embodiment of the present invention.

Here, FIG. 12 is a graph showing a relationship between a frequency characteristic of a package and thickness of a metal lead of the embodiment of the present invention.

In FIG. 12, the horizontal axis represents the thickness ("t" in FIG. 2) of the metal lead 20 and the vertical axis represents the 3 dB cut-off frequency (GHz).

Referring to FIG. 12, in a case where the thickness ("t" in FIG. 2) of the metal lead 20 is equal to or greater than approximately 0.05 mm and equal to or smaller than 0.3 mm, the 3 dB cut-off frequency is equal to or greater than 40 GHz. Hence, it is possible to apply this to the communication system wherein the signal transmission speed is equal to or greater than 40 Gbps.

Referring back to FIG. 2, in the embodiment of the present invention, the LSI 12 as the electronic component is mounted on the substantially center part of the main surface of the package substrate 11. Here, the relationship between the thickness of the LSI 12 and the thickness of the package substrate 11 is discussed with reference to FIG. 13 through FIG. 15.

Figure 13:
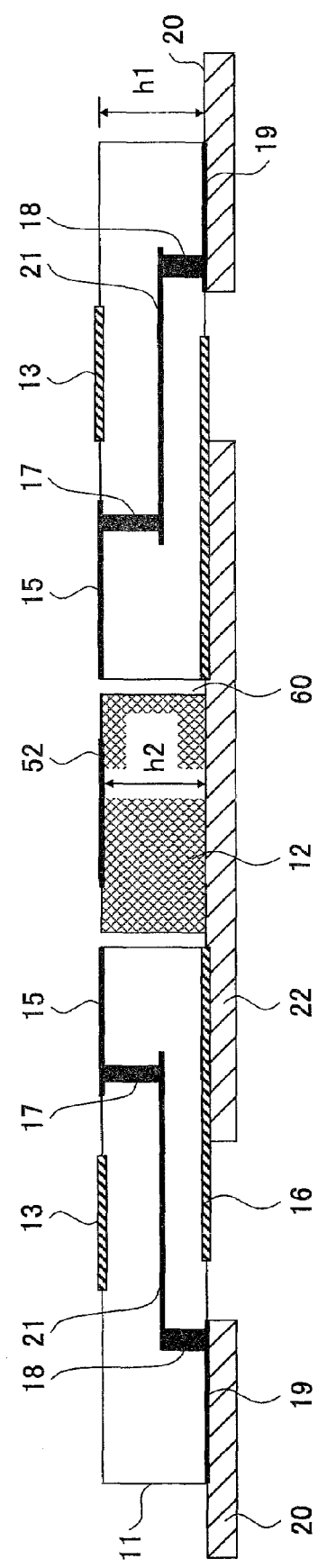
FIG. 13 is a first view showing a relationship between thickness of an LSI and thickness of the package substrate.
Figure 14:
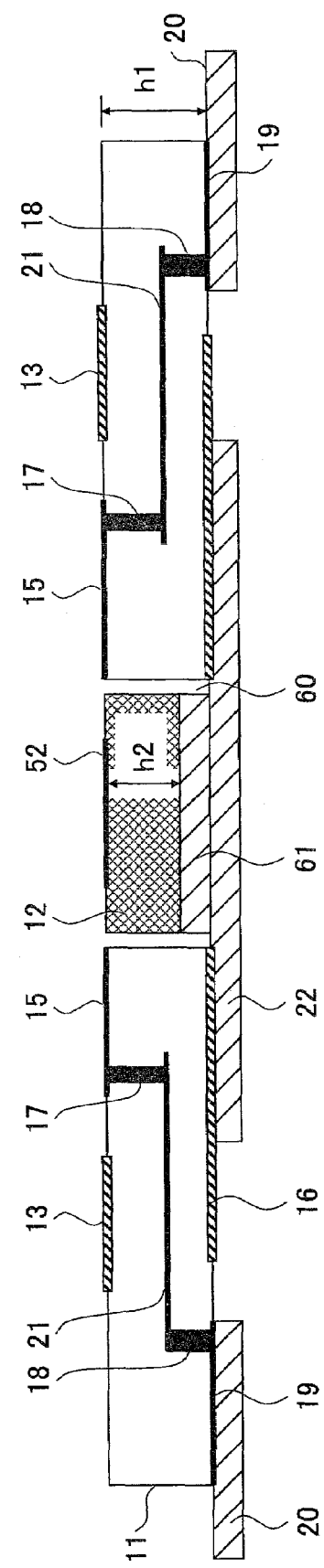
FIG. 14 is a second view showing the relationship between thickness of the LSI and thickness of the package substrate.
Figure 15:
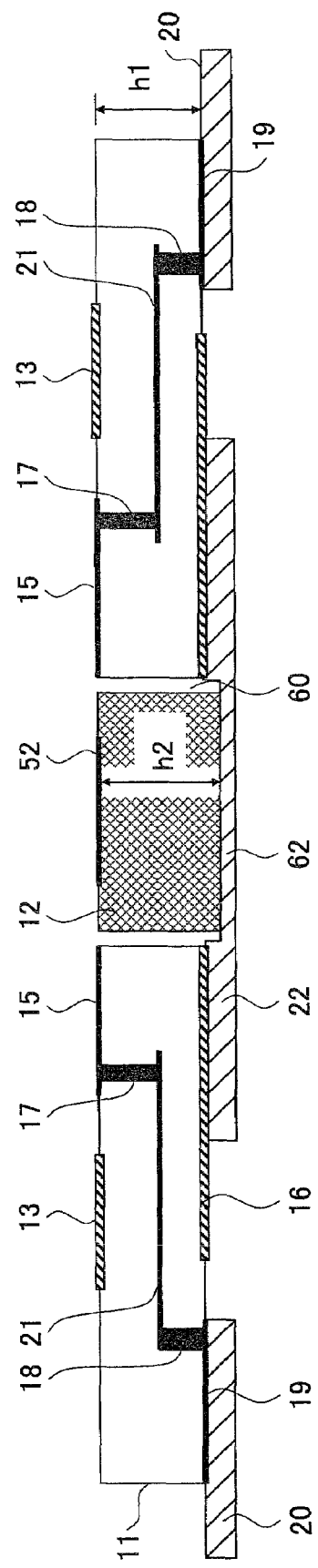
FIG. 15 is a third view showing the relationship between thickness of the LSI and thickness of the package substrate.

Here, FIG. 13 through FIG. 15 provide first through third views showing the relationship between thickness of an LSI and thickness of the package substrate. FIG. 13 through FIG. 15 are, respectively, cross-sectional views of the package substrate 11 where the lid part 14 is not provided on the upper surface of the package substrate 11. In FIG. 13 through FIG. 15, parts that are the same as the parts shown in FIG. 2 are given the same reference numerals, and explanation thereof is omitted.

Referring to FIG. 13, a hole forming part 60 is formed in the center of the package substrate 11. The LSI 12 having the upper surface where the signal line 52 is provided is provided on a metal plate 22 in the hole forming part 60. Here, the thickness h1 of the package substrate 11 is substantially the same as the thickness h2 of the LSI 12. Therefore, the first signal line 15 provided on the upper surface of the package substrate 11 and the signal line 52 provided on the upper surface of the LSI 12 are situated at the substantially same surface (coplanar with each other). Therefore, it is possible to easily connect the first signal line 15 and the signal line 52 by the bonding wires 25 shown in FIG. 3.

In a case where the thickness h1 of the package substrate 11 is greater than the thickness h2 of the LSI 12 (h2<h1) the structure shown in FIG. 14 may be applied. In other words, an LSI mounting metal plate 61 is provided between the lower surface of the LSI 12 and the metal plate 22 so that the first signal line 15 provided on the upper surface of the package substrate 11 and the signal line 52 provided on the upper surface of the LSI 12 are situated at the substantially same surface (coplanar with each other). Therefore, it is possible to easily connect the first signal line 15 and the signal line 52 by the bonding wires 25 shown in FIG. 3. The LSI mounting metal plate 61, as well as the metal plate 22, are made of a metal such as gold (Au), copper (Cu), or the like.

In a case where the thickness h2 of the LSI 12 is greater than the thickness h1 of the package substrate 11 (h2>h1), a structure shown in FIG. 15 may be applied. In other words, a concave part 62 is formed in the upper surface of the metal plate 22 and the LSI 12 is provided in the concave part 62. The difference between the thickness h2 of the LSI 12 and the thickness h1 of the package substrate 11 is absorbed so that the first signal line 15 provided on the upper surface of the package substrate 11 and the signal line 52 provided on the upper surface of the LSI 12 are situated at the substantially same surface (coplanar with each other). Therefore, it is possible to easily connect the first signal line 15 and the signal line 52 by the bonding wires 25 shown in FIG. 3.

Meanwhile, in this embodiment, the LSI 12 is mounted on the package substrate 11 by the wire bonding method. However, the present invention is not limited to this. For example, as shown in FIG. 16, the LSI 12 may be flip-chip mounted on the package substrate 11.

Figure 16:
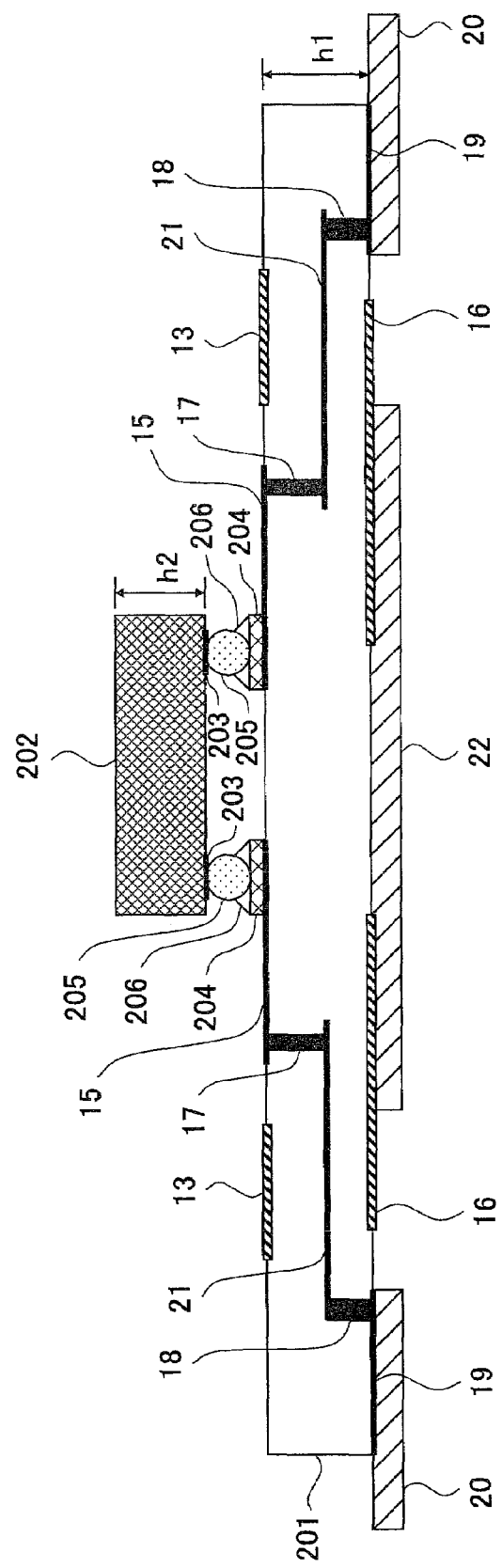
FIG. 16 is a view showing an example where the LSI is flip-chip mounted on the package substrate.

Here, FIG. 16 is a view showing the example where the LSI is flip-chip mounted on the package substrate.

Referring to FIG. 16, in this example, the hole forming part 60 shown in FIG. 13 and others is not provided in the package substrate 11. In any position, the package substrate 11 has a substantially constant thickness h1.

The LSI 202 having the thickness h2 is mounted face-down so that the surface where an outside connection electrode 205 called a bump is formed on the electrode 203 faces the upper surface of the package substrate 11. In other words, the LSI 202 is flip-chip mounted on the package substrate 11 so that the electrode 203 of the LSI 202 is connected to the pad 204 connected to the first signal line 15, via the outside connection electrode 205.

The outside connection electrode 205 formed on the LSI 202 is made of, for example, gold (Au), solder, or the like. The outside connection electrode 205 may be formed by gold plating. It is preferable that the pad 204 connected to the first signal line 15 be made of a material having high conductivity such as gold (Au), copper (Cu), aluminum (Al), or the like.

In this example, the outside connection electrode 205 and the pad 204 are connected via a solder 206.

The LSI 202 can be connected to the package substrate 11 without using the bonding wires 25 shown in FIG. 3 by such flip-chip connecting. There are no limitations to the thickness h1 of the package substrate 11 and the thickness h2 of the LSI 12. In addition, the frequency characteristic of the package substrate 11 is not limited by the thickness h2.

Meanwhile, in the above-discussed embodiment of the present invention, the lid part 14 provided on the first ground conductor 13 is made of, for example, metal or a dielectric material. However, as shown in FIG. 17 or FIG. 18, an electromagnetic wave absorption body 65 may be provided on the lid part 14.

Figure 17:
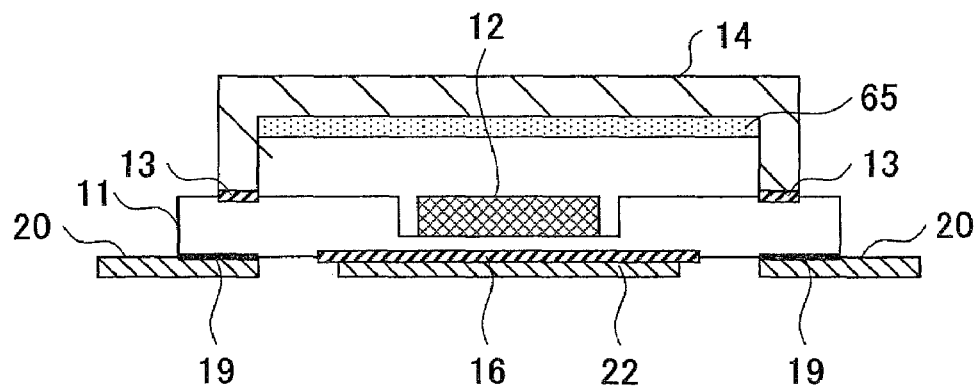
FIG. 17 is a view showing a first example where an electromagnetic wave absorption body is provided on the lid part.
Figure 18:
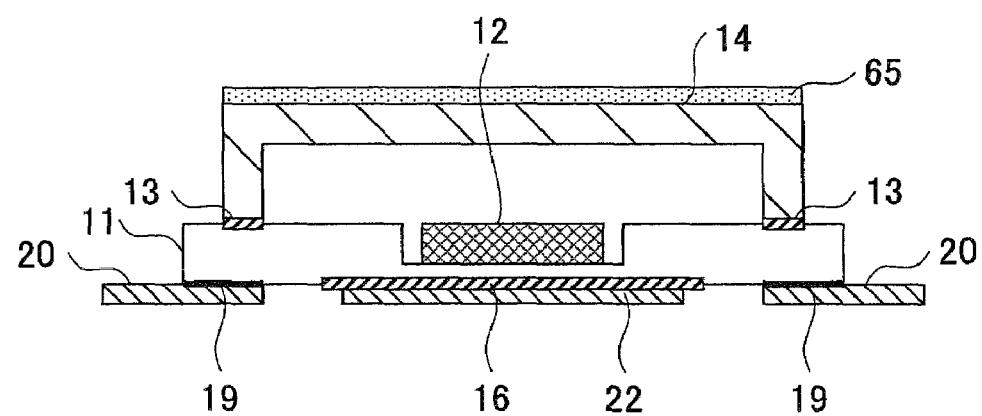
FIG. 18 is a view showing a second example where the electromagnetic wave absorption body is provided on the lid part.

Here, FIG. 17 is a view showing a first example where an electromagnetic wave absorption body is provided on the lid part and FIG. 18 is a view showing a second example where the electromagnetic wave absorption body is provided on the lid part. In FIG. 17 and FIG. 18, parts that are the same as the parts shown in FIG. 2 are given the same reference numerals, and explanation thereof is omitted. In FIG. 17 and FIG. 18, illustrations of the first signal line 15, the second signal line 19, the third signal line 21, the first via-hole 17, and the second via-hole 18 are omitted.

In the example shown in FIG. 17, the electromagnetic wave absorption body 65 is provided on an internal surface of the lid part 14 provided on the first ground conductor 13. On the other hand, in the example shown in FIG. 18, the electromagnetic wave absorption body 65 is provided on an external surface of the lid part 14 provided on the first ground conductor 13.

An electromagnetic wave generated in the cavity formed by the lid part 14 and the upper surface of the package substrate 11 is absorbed by the electromagnetic wave absorption body 65. Hence, it is possible to prevent the reflection of the electromagnetic wave and cavity resonance in the cavity. In addition, it is possible to prevent the electromagnetic wave from being leaked to the outside of the lid part 14.

As the electromagnetic wave absorption body 65, a compound of carbonyl iron may be used in a case where the applicable frequency range is approximately 10 through 30 GHz; composite carbonyl iron or a compound of silicon and carbonyl iron may be used in a case where the applicable frequency range is approximately 3 through 30 GHz; ferrite, ferrite magnetic material, or carbonyl iron powder may be used in a case where the applicable frequency range is approximately 3 through 10 GHz; composite ferrite may be used in a case where the applicable frequency range is approximately 0.7 through 16 GHz; a PET filament with Au, Ag, Cu, or Al mesh may be used in a case where the applicable frequency range is approximately 4 MHz through 10 GHz;

and a filament with multi-layers of conductive fiber may be used in a case where the applicable frequency range is approximately 22 through 50 GHz.

As the electromagnetic wave absorption body 65, any combination or compound of the above materials or multi-layer structures may be used in a case where the applicable frequency range is approximately 4 MHz through 50 GHz. In addition, as the electromagnetic wave absorption body 65, electromagnetic wave absorption sheet, plate, or mesh (net) may be used.

Second Embodiment of the Present Invention

In the above-discussed first embodiment of the present invention, the package substrate 11 has a structure where three signal lines 15, 19 and 21 are alternately provided in the thickness direction. However, the present invention is not limited to this example. The present invention can be applied to a three-layer structure where four signal lines are alternately provided in the thickness direction as an example of a multi-layer structure.

Figure 19:
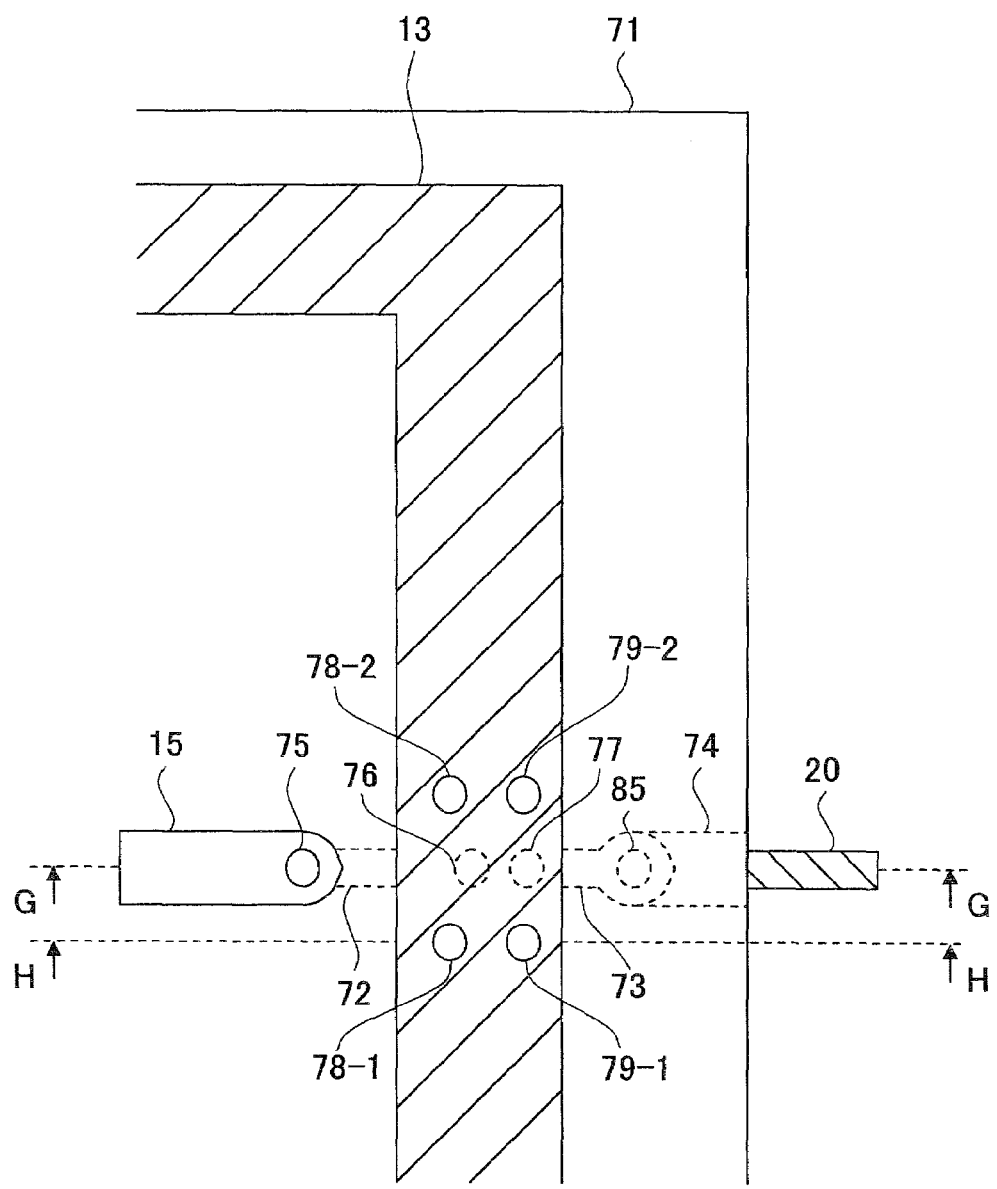
FIG. 19 is a plan view showing a part of a package substrate having a three-layer structure of a second embodiment of the present invention.
Figure 20:
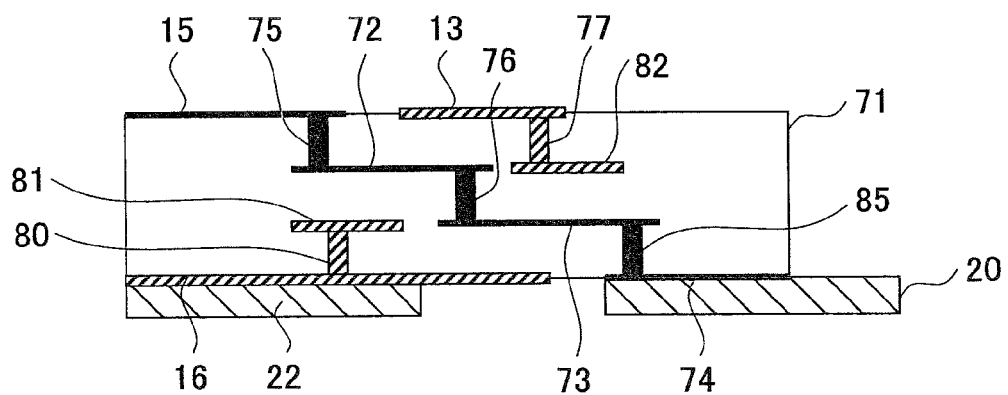
FIG. 20 is a cross-sectional view taken along line G-G of FIG. 19.
Figure 21:
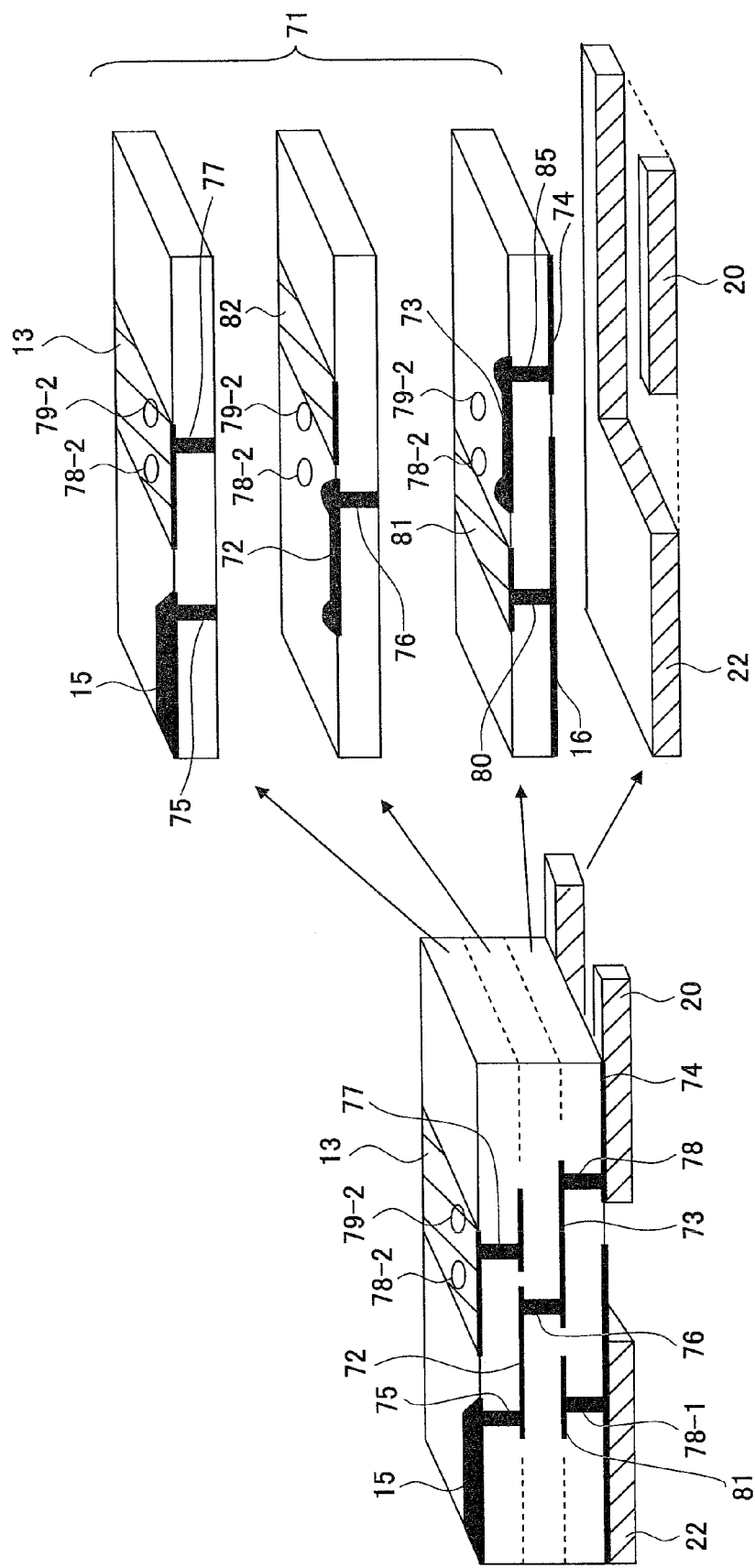
FIG. 21 is a three dimensional view of the three layer structure of the package substrate.
Figure 22:
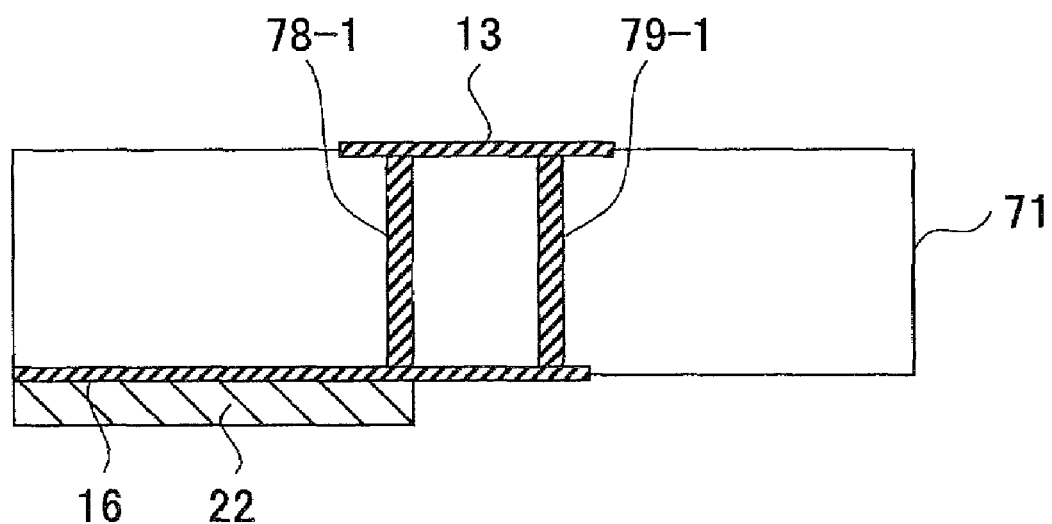
FIG. 22 is a cross-sectional view taken along a line H-H of FIG. 19.

Here, FIG. 19 is a plan view showing a part of a package substrate having the three-layer structure of a second embodiment of the present invention. FIG. 20 is a cross-sectional view taken along line G-G of FIG. 19. FIG. 21 is a three dimensional view of the three layer structure of the package substrate. FIG. 22 is a cross-sectional view taken along a line H-H of FIG. 19. In FIG. 19 through FIG. 22, parts that are the same as the parts discussed above are given the same reference numerals, and explanation thereof is omitted. For convenience of explanation, a single step of four signal lines provided in the three-layer structure is shown in FIG. 19. In addition, in FIG. 19, as well as FIG. 3, the illustration of the lid part 14 shown in FIG. 2 is omitted.

Referring to FIG. 19 through FIG. 21, especially FIG. 20 and FIG. 21, a package substrate 71 being a dielectric substrate is formed by three layers having substantially the same thickness. At a top-most layer including an upper surface (first surface) of the package substrate 71 where the first signal line 15 and the first ground conductor 13 are provided, a first via-hole 75 is formed from the first signal line 15 and a second via-hole 77 as a ground conductor connection via-hole is formed from the first ground conductor 13 in the thickness direction.

A sixth via-hole 78-2 (78-1) and a seventh via-hole 79-2 (79-1) being ground conductor connection via-holes are formed from the first ground conductor 13 to the second ground conductor 16 provided on the lower surface (second surface) of the package substrate 71.

A third signal line 72 and a third ground conductor 82 are provided on the upper surface of the intermediate layer provided under the top-most layer. The third signal line 72 is a layer signal line connected to the first signal line 15 via the first via-hole 75. The third ground conductor 82 is a layer ground conductor connected to the first ground conductor 13 via the second via-hole 77. In addition, the third via-hole 76 is formed in the thickness direction at an end part of the third signal line 72 where the first via-hole 75 is not connected.

A fourth signal line 73 is provided on the upper surface of a bottom layer provided under the intermediate layer. The fourth signal line 73 is a layer signal line having an end part connected to the third via-hole 76.

A fourth via-hole 85 is formed in the thickness direction at an end part of the fourth signal line 73 at a side where the third via-hole 76 is not connected so as to connected to the second signal line 74 provided on the lower surface of the bottom layer.

The second signal line 74 is connected to the metal lead 20 extending outside of the package substrate 71.

In addition, a fourth ground conductor 81 is provided on the upper surface of the bottom layer as the layer ground conductor. The fourth ground conductor 81 is connected to the second ground conductor 16 provided on the lower surface of the bottom layer via the fifth via-hole 80 as a ground conductor connection via-hole formed in the thickness direction of the bottom layer. The metal plate 22 is provided under the second ground conductor 16.

Referring to FIG. 19 through FIG. 22, as discussed above, the first ground conductor 13 provided on the upper surface of the package substrate 71 and the second ground conductor 16 provided on the lower surface of the package substrate 71 are connected by the sixth via-hole 78-2 (78-1) and the seventh via-hole 79-2 (79-1) being the ground conductor connection via-holes.

The package substrate 71 having such a structure is formed by stacking the bottom layer, the intermediate layer and the top-most layer in this order. In addition, the via-holes may be made by a well-known method. For example, a hole may be formed in the package substrate 71 mechanically or by using a laser and the entirety of the hole may be plated for conducting so that the first via-holes can be made. Furthermore, layers where the holes are formed by using the laser or the like may be stacked and metal pastes may be used to fill in the holes so that the via-holes can be made.

Under this structure, the first signal line 15 is connected to the second signal line 74 via the first via-hole 75, the third signal line 72, the third via-hole 76, the fourth signal line 73 and the fourth via-hole 85 so that the signal is transmitted. The third signal line 72 and the fourth signal line 73 form a substrate-buried signal line.

The third signal line 72 and the fourth signal line 73 are put between the first ground conductor 13 provided on the upper surface of the package substrate 71 and the second ground conductor 16 provided on the lower surface of the package substrate 71, respectively. In addition, the third signal line 72 and the fourth signal line 73 are put between the sixth via-hole 78-2 (78-1) and the seventh via-hole 79-2 (79-1) being the ground conductor connection via-holes connecting the first ground conductor 13 to the second ground conductor 16 on the right and left. Under this state, the third signal line 72 and the fourth signal line 73 are provided inside of the package substrate 71. In other words, the third signal line 72 and the fourth signal line 73 are provided under a tunnel structure so as to be surrounded on all side inside of the package substrate 71.

Thus, by providing the ground conductors on all four side of the third signal line 72 and the fourth signal line 73, it is possible to perform impedance matching so that the input and output impedances have desirable value such as approximately 50 Ω each.

The sixth via-hole 78-2 (78-1) and the seventh via-hole 79-2 (79-1) being the ground conductor connection via-holes connecting the first ground conductor 13 to the second ground conductor 16 function as direct and short paths of a return current of a signal. Therefore, an electric floating state of the first ground conductor 13 can be avoided and generation of resonance can be prevented.

Furthermore, in this example, the third ground conductor 82 connected to the first ground conductor 13 via the second via-hole 77 being a ground conductor connection via-hole is provided in the vicinity of the third signal line 72. The fourth ground conductor 81 connected to the second ground conductor 16 via the fifth via-hole 80 being a ground conductor connection via-hole is provided in the vicinity of the fourth signal line 73. Therefore, it is possible to securely achieve the above-mentioned impedance matching.

Third Embodiment of the Present Invention

In the above-discussed first and second embodiments of the present invention, the lid part 14 provided on the upper surface of the package substrate 11 or 71 has the cross-section of a rectangular shape without one side (inverted "U" shape). However, a part where the lid part and the package substrate 11 come in contact with each other may have a configuration shown in FIG. 23 through FIG. 25, so that a lid part 14 having a plate shape may be mounted on a package substrate 11.

Figure 23:
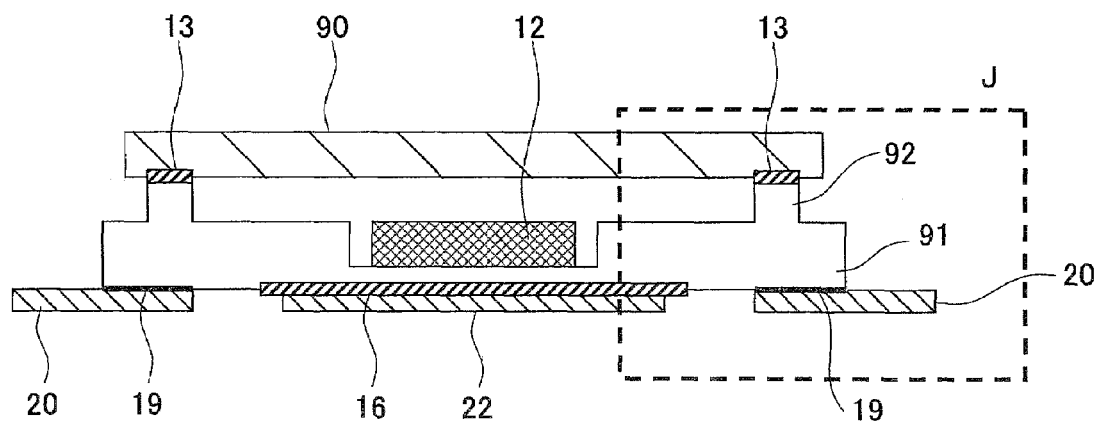
FIG. 23 is a view showing a schematic structure of a package having an electronic component of a third embodiment of the present invention.
Figure 24:
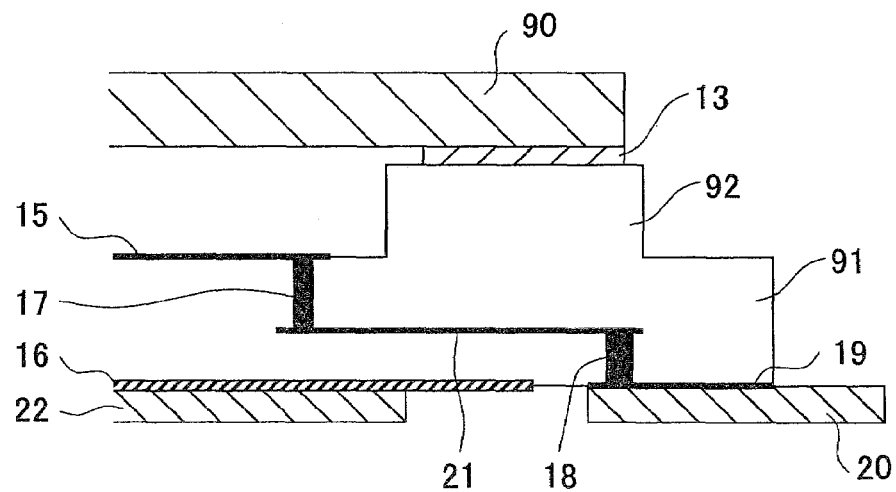
FIG. 24 is a detail view of a part surrounded by a dotted line J in FIG. 23.
Figure 25:
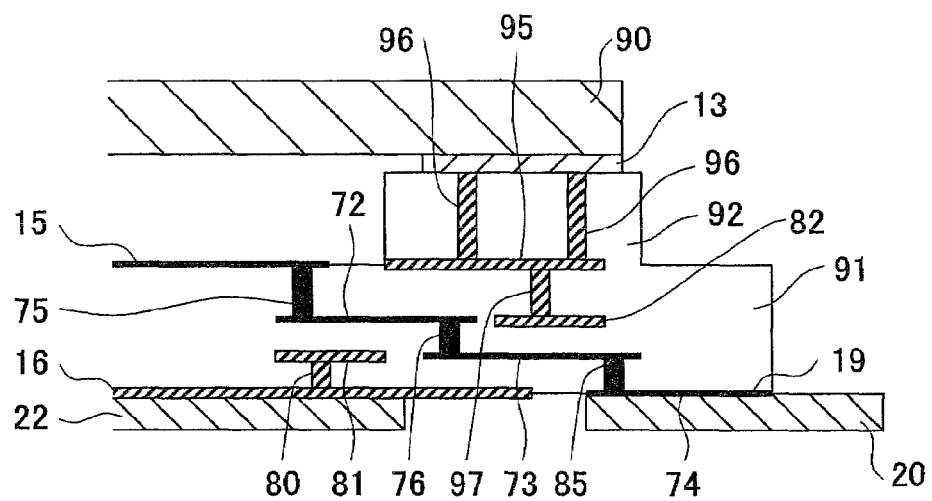
FIG. 25 is a view of a modification to the example shown in FIG. 24.

Here, FIG. 23 is a view showing a schematic structure of a package having an electronic component of a third embodiment of the present invention. FIG. 24 is a detail view of a part surrounded by a dotted line J in FIG. 23. FIG. 25 is a view of a modification of the example shown in FIG. 24. In FIG. 23 through FIG. 25, parts that are the same as the parts discussed above are given the same reference numerals, and explanation thereof is omitted. For the convenience of explanation, illustration of the signal lines is omitted in FIG. 23.

Referring to FIG. 23 and FIG. 24, in this embodiment, in the vicinity of the end part of the package substrate 91 being a dielectric substrate, the wall part 92 is formed in a substantially rectangular shape in plan view. The wall part 92 is made of a multi-layer dielectric material. The thickness of the wall part 92 is greater than the thickness of other parts of the package substrate 91. In this example, unlike the structure shown in FIG. 2, the first ground conductor 13 is formed on the upper surface (first surface) of the wall part 92 thick enough so that, for example, the wall part 92 and the lid part 90 can be directly welded or soldered together.

Since the thickness of the wall part 92 is greater than other parts of the package substrate 91, a cavity receiving the LSI 12 is formed by making the wall part 92 and the lid part 90 contact each other. Therefore, in this embodiment unlike the first and second embodiments of the present invention, it is possible to make the lid part 90 have a plane plate configuration.

The internal structure of the wall part 92 may be as shown in FIG. 25. In the example shown in FIG. 25, the internal structure of the package substrate 91 is the same as the structure of the second embodiment of the present invention discussed with reference to FIG. 20, namely the three-layer structure where four signal lines are alternately provided in the thickness direction. In addition, a ground structure whereby the first ground conductor 13 and the third ground conductor 82 are connected to each other is provided inside of the wall part 92.

More specifically, a fifth ground conductor 95 is provided between the first ground conductor 13 and the third ground conductor 82. The first ground conductor 13 and the fifth ground conductor 95 are connected by the eighth via-hole 96 formed in the thickness direction of the package substrate 91. The third ground conductor 82 and the fifth ground conductor 95 are connected by the ninth via-hole 97 formed in the thickness direction of the package substrate 91. Under this structure, it is possible to securely achieve the impedance matching.

Fourth Embodiment of the Present Invention

In the first embodiment of the present invention, as shown in FIG. 2, the package substrate 11 has a structure where three signal lines 15, 19 and 21 are alternately provided in the thickness direction. However, as shown in FIG. 26 through FIG. 29, third signal line ground conductors 100 may be provided at right and left sides of the third signal line 21 in parallel with the third signal line 21 at the substantially same surface as (coplanar with) the surface where the third signal line 21 is provided.

Figure 26:
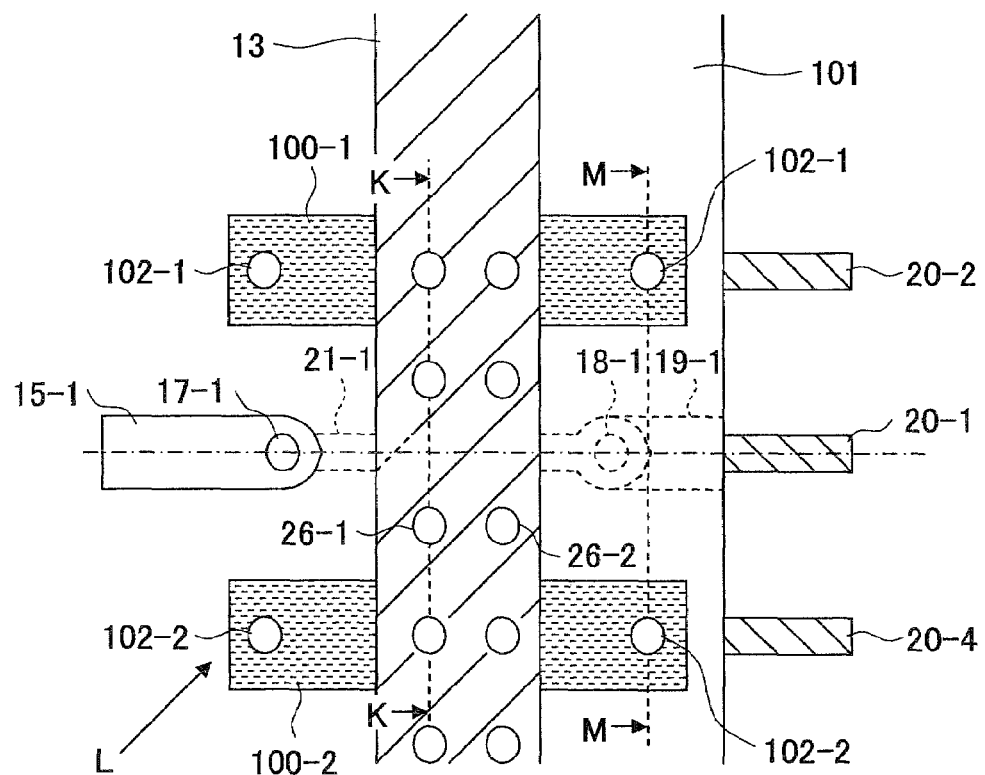
FIG. 26 is a plan view showing a part of a package substrate having a third signal line ground conductor of a fourth embodiment of the present invention.
Figure 27:
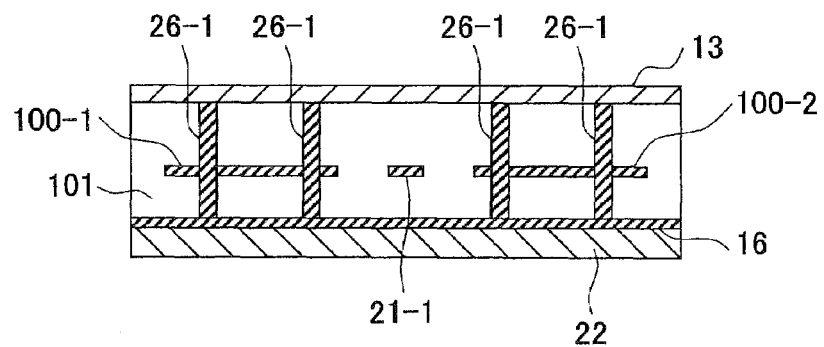
FIG. 27 is a cross-sectional view taken along line K-K in FIG. 26.
Figure 28:
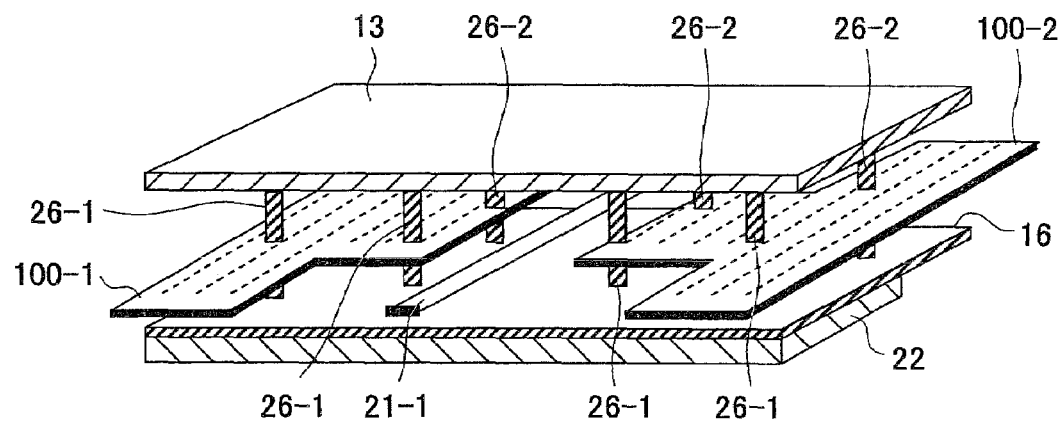
FIG. 28 is a perspective view seen from a direction by an arrow L in FIG. 26.
Figure 29:
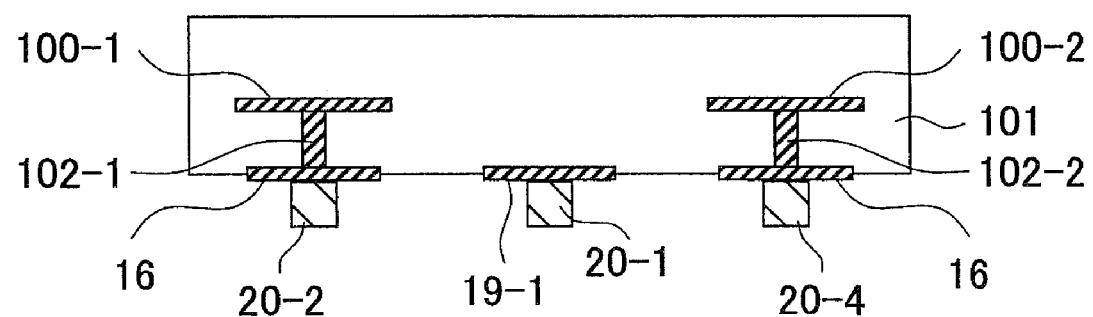
FIG. 29 is a cross-sectional view taken along a line M-M in FIG. 26.

FIG. 26 is a plan view showing a part of a package substrate having a third signal line ground conductor of a fourth embodiment of the present invention. FIG. 27 is a cross-sectional view taken along line K-K in FIG. 26. FIG. 28 is a perspective view seen from a direction by an arrow L in FIG. 26. FIG. 29 is a cross-sectional view taken along a line M-M in FIG. 26. In FIG. 26 through FIG. 29, parts those are the same as the parts discussed above are given the same reference numerals, and explanation thereof is omitted. For the convenience of explanation, a single set of three signal lines 15, 19 and 21 is illustrated.

Referring to FIG. 26 through FIG. 28, in the dielectric package substrate 101, third signal line ground conductors 100-1 and 100-2 are provided at left and right sides of the third signal line 21-1 in parallel with the third signal line 21-1 at the substantially same surface as (coplanar with) the surface where the third signal line 21-1 is provided. The third signal line ground conductors 100-1 and 100-2 function as substrate internal ground conductors.

Only a single set of the three signal lines 15, 19 and 21 is shown in FIG. 26 and the third signal line ground conductors 100-1 and 100-2 are provided at left and right sides of the third signal line 21-1. However, in a case where plural third signal lines 21 are provided, the third signal line ground conductors 100-1 and 100-2 may be provided between the neighboring third signal lines 21.

The third signal line ground conductors 100-1 and 100-2, the first ground conductor 13 provided on an upper surface (first surface) of the package substrate 101, and the second ground conductor 16 provided on the lower surface (second surface) of the package substrate 101 are connected to each other by the first ground conductor connection via-holes 26-1.

At a lower side of a part of the first ground conductor 13 corresponding to a part where the set of the signal lines 15, 19 and 21 is not provided, the third signal line ground conductors 100-1 and 100-2 extend outside of the first ground conductor 13.

In addition, only the second ground conductor 16 is connected to extending parts of the third signal line ground conductors 100-1 and 100-2 via the third signal line ground conductors 100-1 and 100-2. Therefore, as the first ground conductor 13, the same size and configuration as the examples shown in FIG. 2 through FIG. 8 can be applied.

Next, the transmission characteristic of the package substrate 101 having the structures shown in FIG. 26 through FIG. 29 is discussed with reference to FIG. 30.

Figure 30:
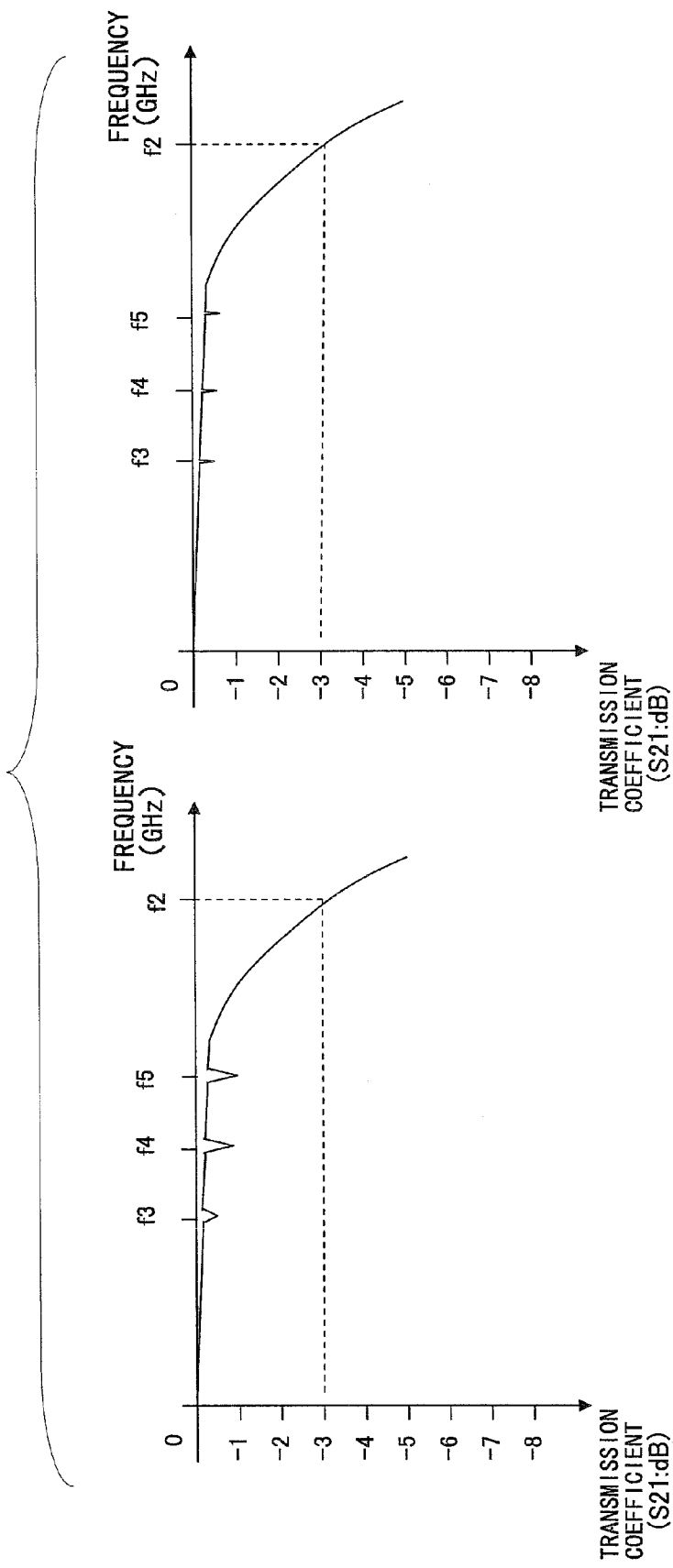
FIG. 30 is a graph showing a transmission characteristic of the package substrate shown in FIG. 26 through FIG. 29.

Here, FIG. 30 is a graph showing a transmission characteristic of a package substrate 101 having a structure shown in FIG. 26 through FIG. 29.

More specifically, FIG. 30-(a) is a graph showing the transmission characteristic of the package substrate 101 having the structure shown in FIG. 26 through FIG. 29. FIG. 30-(b) is a graph, for comparison, showing the transmission characteristic of the package substrate having no third signal line ground conductors 100-1 and 100-2. In the graph shown in FIG. 30, the horizontal axis represents a frequency (GHz) and the vertical axis represents a transmission characteristic S21 (dB). A characteristic curve represents the frequency characteristic.

In the graph shown in FIG. 30, f2 represents, as shown in FIG 11, a 3 dB cut-off frequency where there is 3 dB of attenuation. In addition, f3 through f5, namely fn represents a frequency calculated by the following formula when Er represents a dielectric constant of the package substrate.

*fn*=speed of light/(2×distance between one signal line and the other signal line×*Er*)

For example, the length between the third signal line 21-1 and the neighboring third signal line 21-3 is approximately 0.3 mm. If the package substrate is made of ceramic, the dielectric constant is approximately 8. Therefore, the resonance frequency is calculated as approximately 20 GHz.

As shown in FIG. 30-(*b*), in the package substrate having a structure where the third signal line ground conductors 100-1 and 100-2 are not provided, the transmission characteristic is degraded due to the resonance between the signal lines at the frequency f3 through f5. On the other hand, as shown in FIG. 30-(*a*), in the package substrate 101 having the structure shown in FIG. 26 through FIG. 29, the degradation of the transmission characteristic due to such a resonance is improved so that the frequency response can be improved.

In the meantime, in this example, a single layer of the third signal line ground conductors 100-1 and 100-2 is provided in the package substrate 101. However, if necessary, plural layers of the third signal line ground conductors 100-1 and 100-2 may be provided.

In the examples shown in FIG. 26 through FIG. 29, the same size and configuration as those shown in FIG. 2 through FIG. 8 are applied to the first ground conductor 13. However, the width of the first ground conductor 13 may be changed as shown in FIG. 31.

Figure 31:
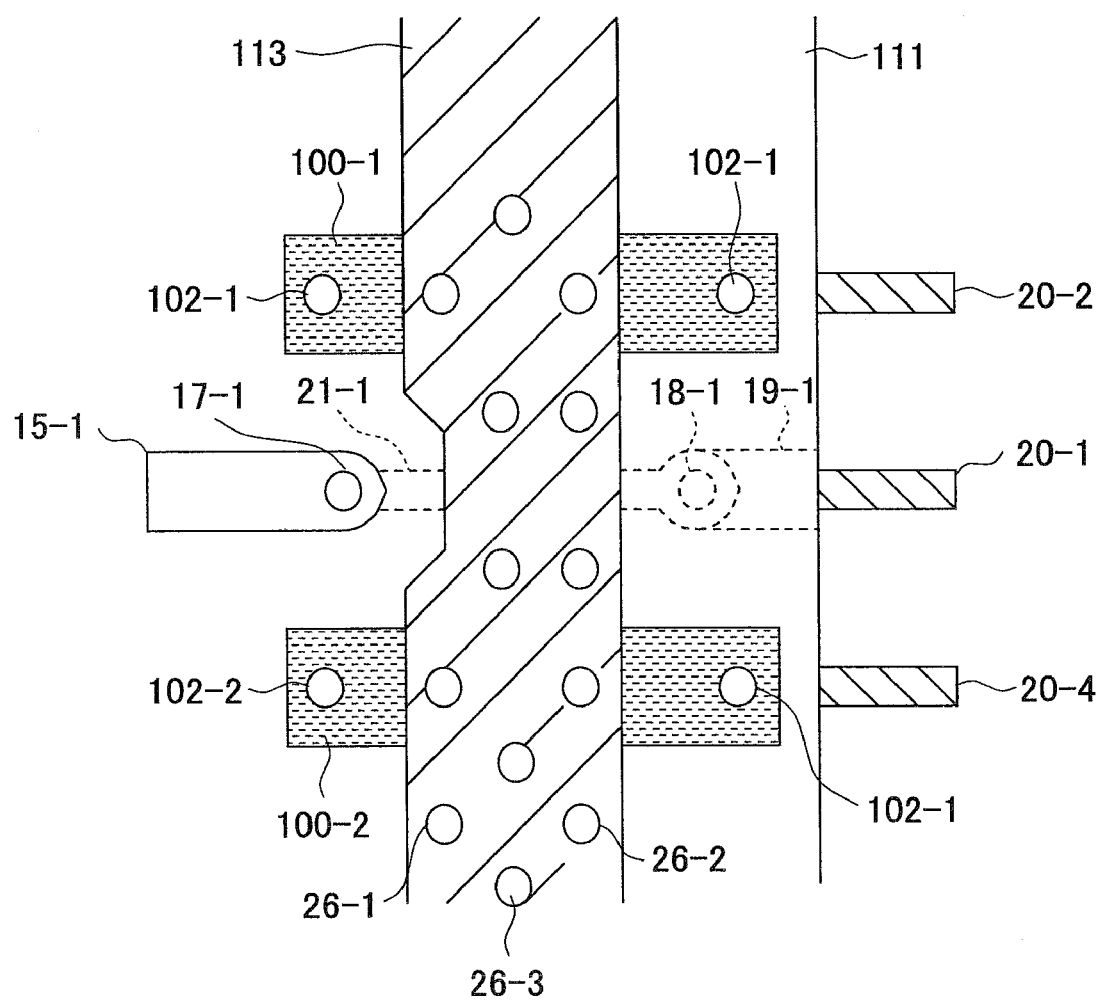
FIG. 31 is a plan view showing a part of a package substrate of a modified example of the package substrate shown in FIG. 26.

FIG. 31 is a plan view showing a part of a package substrate 101 of a modified example of the package substrate shown in FIG. 26. In FIG. 31, parts that are the same as the parts shown in FIG. 26 through FIG. 29 are given the same reference numerals, and explanation thereof is omitted.

Referring to FIG. 31, in this example, the width of the first ground conductor 113 provided on the upper surface of the package substrate 111 is greater than the width of the first ground conductor 13 shown in FIG. 26 or the like. A part of the first ground conductor 113 corresponding to a part where the third signal line 21-1 is provided has a concave configuration in plan view. The width of the part of the first ground conductor 113 corresponding to a part where the third signal line 21-1 is provided is narrower than other parts. In the example shown in FIG. 31, the concave part has a substantially trapezoidal configuration. However, the present invention is not limited to this example. There is no limitation to the configuration of the concave part. The configuration of the concave part may be, for example, a circular-shape configuration.

In the wide part of the first ground conductor 113, the first ground conductor connection via-hole 26-1 and the second ground conductor connection via-hole 26-2 are provided. The first ground conductor connection via-hole 26-1 and the second ground conductor connection via-hole 26-2 connect the first ground conductor 113, the second ground conductor 16 provided on the lower surface of the package substrate 111, and the third signal line ground conductors 100-1 and 100-2 provided at left and right sides of the third signal line 20-1.

Furthermore, in the wide part of the first ground conductor 113, the fourth ground conductor connection via-hole 26-3 is provided between the first ground conductor connection via-hole 26-1 and the second ground conductor connection via-hole 26-2. The fourth ground conductor connection via-hole 26-2 connects the first ground conductor 113, the second ground conductor 16, and the third signal line ground conductors 100-1 and 100-2 provided at left and right sides of the third signal line 20-1.

In the narrow part of the first ground conductor 113, while, the first ground conductor connection via-hole 26-1 and the second ground conductor connection via-hole 26-2 are provided, the fourth ground conductor connection via-hole 26-3 is not provided.

Thus, the number of the via-holes 26 at a part formed other than a part corresponding to where the third signal line 21-1 is provided on the first ground conductor 113 provided on the upper surface of the package substrate 111 is larger than that of the examples shown in FIG. 26 through FIG. 29. Here, the via-hole 26 connects the first ground conductor 13, the second ground conductor 16, and the third signal line ground conductors 100-1 and 100-2 provided at left and right sides of the third signal line 20-1. Accordingly, it is possible to securely perform impedance matching so that the input and output impedances of the third signal line 21-1 provided at the package substrate 111 have desirable value such as approximately 50 Ω each.

The transmission characteristic of the package substrate 111 is discussed with reference to FIG. 32. Here, FIG. 32 is a graph showing a transmission characteristic of a package substrate 111 having a structure shown in FIG. 31.

In the graph shown in FIG. 32, the horizontal axis represents a frequency (GHz) and the vertical axis represents a transmission characteristic S21 (dB). A characteristic curve represents the frequency characteristic. "f2" represents, as shown in FIG. 30, a 3 dB cut-off frequency where there is 3 dB of attenuation. In addition, f3 through f5, namely fn, represents a frequency calculated by the formula mentioned above.

As shown in FIG. 32, in this example as compared with the structure shown in FIG. 26, the degradation of the transmission characteristic due to the resonance between the signal lines is further prevented so that the frequency response can be further improved.

Thus, as discussed above, according to the embodiments of the present invention, the signal line is provided in the package substrate in a state where the signal line is put, at least, up and down, between the ground conductors provided on the upper and lower surfaces of the package substrate.

Therefore, between the signal line of the printed wiring board on which the package substrate is mounted and the electronic component provided on the package substrate, it is possible to securely perform impedance matching so that the input and output impedances have desirable values such as approximately 50 Ω each. Therefore, it is possible to realize high speed communication having low transmission loss.

In addition, according to the embodiments of the present invention, it is possible to achieve the above-mentioned transmission characteristic by a simple structure without making the size of the package substrate large.

Furthermore, the second ground conductor provided on the lower surface of the package substrate and the ground conductor of the printed wiring board are connected by the metal lead. The first ground conductor provided on the upper surface of the package substrate and the second ground conductor are connected by the ground conductor connection via-hole. Hence, the manufacturing of the package substrate and mounting the package substrate on the printed wiring board can be implemented with high yield and thus the present invention is suitable for mass manufacturing.

The present invention is not limited to these embodiments, but variations and modifications may be made without departing from the scope of the present invention.

This patent application is based on Japanese Priority Patent Application No. 2006-113454 filed on Apr. 17, 2006, the entire contents of which are hereby incorporated by reference.

What is claimed is:

1. An electronic component package, comprising:
a dielectric substrate having a first surface where an electronic component is sealed;
wherein a first signal line connecting to the electronic component and a first ground conductor are formed on the first surface of the dielectric substrate;
a second signal line connected to an outside connection electrode and a second ground conductor are formed on a second surface of the dielectric substrate;
the first ground conductor and the second ground conductor are connected by a plurality of ground conductor via-holes; and
a substrate-buried signal line connected to the first signal line and the second signal line is provided inside of the dielectric substrate so as to be put between the first ground conductor and the second ground conductor above and below and between the ground conductor via-holes on the right and left.

2. The electronic component package as claimed in claim 1,
wherein the substrate-buried signal line is connected to the first signal line and the second signal line by a via-hole.

3. The electronic component package as claimed in claim 1,
wherein the electronic component is sealed by providing a lid part on the dielectric substrate; and
the first ground conductor functions as a contact between the dielectric substrate and the lid part.

4. The electronic component package as claimed in claim 1,
wherein the first ground conductor is provided on the first surface of the dielectric substrate in a ring shape.

5. The electronic component package as claimed in claim 3,
wherein an electromagnetic wave absorption body is provided on an inside surface or an outside surface of the lid part.

6. The electronic component package as claimed in claim 1,
wherein the outside connection electrode is a metal lead.

7. The electronic component package as claimed in claim 6,
wherein the metal lead has thickness equal to or greater than 0.05 mm and equal to or smaller than 0.3 mm.

8. The electronic component package as claimed in claim 1,
wherein a ground conductor electrode extended from the second ground conductor is formed at both sides of the outside connection electrode connected to the second signal line.

9. The electronic component package as claimed in claim 1,
wherein a metal plate is provided under the second signal line.

10. The electronic component package as claimed in claim 1,
wherein a first surface of the electronic component is positioned substantially coplanar with the first surface of the dielectric substrate.

11. The electronic component package as claimed in claim 1,
wherein the dielectric substrate is a multi-layer substrate;
a layer signal line is formed on a second surface of each layer of the dielectric substrate; and
the layer signal lines are connected to each other by a via-hole so that the substrate-buried signal line is formed.

12. The electronic component package as claimed in claim 1,
wherein a layer ground conductor is formed in the vicinity of the layer signal line.

13. The electronic component package as claimed in claim 1,
wherein a wall part made of a dielectric material is provided in the vicinity of an end part of the dielectric substrate.

14. The electronic component package as claimed in claim 13,
wherein a ground structure connected to the first ground conductor is formed inside of the wall part.

15. The electronic component package, as claimed in claim 1,
wherein substrate-buried ground conductors are provided at both sides of the substrate-buried signal line.

16. The electronic component package as claimed in claim 15,
wherein the substrate-buried ground conductor has a part extending outside of a portion where the first ground conductor is provided.

17. The electronic component package, as claimed in claim 16,
wherein the substrate-buried ground conductor is connected to the first ground conductor and the second ground conductor by a via-hole.

18. The electronic component package as claimed in claim 16,
wherein the part of the substrate-buried ground conductor extending outside of the portion where the first ground conductor is provided is connected to only the second ground conductor by a via-hole.

19. The electronic component package as claimed in claim 1,
wherein the dielectric substrate is made of ceramic.

* * * * *